US008652938B2

(12) United States Patent
Takamoto et al.

(10) Patent No.: US 8,652,938 B2
(45) Date of Patent: Feb. 18, 2014

(54) THERMALLY RELEASABLE SHEET-INTEGRATED FILM FOR SEMICONDUCTOR BACK SURFACE, METHOD OF COLLECTING SEMICONDUCTOR ELEMENT, AND METHOD OF PRODUCING SEMICONDUCTOR DEVICE

(75) Inventors: Naohide Takamoto, Osaka (JP); Goji Shiga, Osaka (JP); Fumiteru Asai, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/190,664

(22) Filed: Jul. 26, 2011

(65) Prior Publication Data
US 2012/0028442 A1 Feb. 2, 2012

(30) Foreign Application Priority Data

Jul. 29, 2010 (JP) ................... 2010-170919

(51) Int. Cl.
*H01L 21/00* (2006.01)
(52) U.S. Cl.
USPC .............. 438/460; 438/113; 257/E21.599
(58) Field of Classification Search
USPC ................................ 438/460, 114
See application file for complete search history.

(56) References Cited

U.S. PATENT DOCUMENTS 6,488,803 B2 * 12/2002 Kiuchi et al. ............. 156/230
2003/0203193 A1 10/2003 Murata et al.
2004/0000370 A1 * 1/2004 Kiuchi et al. ............. 156/77
2004/0104326 A1 6/2004 Demel et al.
2005/0136251 A1 6/2005 Kishimoto et al.
2007/0026572 A1 * 2/2007 Hatakeyama et al. ........ 438/113
2008/0008831 A1 1/2008 Kishimoto et al.
2009/0053518 A1 2/2009 Saiki et al.
2010/0099240 A1 * 4/2010 Watanabe et al. ............. 438/464
2010/0129986 A1 5/2010 Kamiya et al.
2010/0129987 A1 5/2010 Kamiya et al.
2010/0129989 A1 * 5/2010 Kamiya et al. ................ 438/464
2010/0144120 A1 * 6/2010 Segawa et al. ................ 438/464
2010/0193968 A1 * 8/2010 Takamoto et al. ............. 257/778

(Continued)

FOREIGN PATENT DOCUMENTS

CN 1295103 A 5/2001
CN 101740351 A 6/2010

(Continued)

OTHER PUBLICATIONS

Office Action, dated Oct. 10, 2013, issued by the State Intellectual Property Office of the People's Republic of China in counterpart Chinese Application No. 201110217053.5.

(Continued)

*Primary Examiner* — Michelle Mandala
*Assistant Examiner* — Shaka White
(74) *Attorney, Agent, or Firm* — Sughrue Mion, PLLC

(57) ABSTRACT

The present invention relates to a thermally releasable sheet-integrated film for semiconductor back surface, which includes: a pressure-sensitive adhesive sheet including a base material layer and a pressure-sensitive adhesive layer, and a film for semiconductor back surface formed on the pressure-sensitive adhesive layer of the pressure-sensitive adhesive sheet, in which the pressure-sensitive adhesive sheet is a thermally releasable pressure-sensitive adhesive sheet whose peel force from the film for semiconductor back surface decreases upon heating.

9 Claims, 2 Drawing Sheets

(56) References Cited

U.S. PATENT DOCUMENTS

| | | | |
|---|---|---|---|
| 2010/0314781 A1* | 12/2010 | Hayashi et al. | 257/778 |
| 2011/0156278 A1* | 6/2011 | Takamoto et al. | 257/778 |
| 2012/0028415 A1* | 2/2012 | Shiga et al. | 438/113 |
| 2013/0108847 A1 | 5/2013 | Hayashi et al. | |

FOREIGN PATENT DOCUMENTS

| | | |
|---|---|---|
| CN | 101740352 A | 6/2010 |
| CN | 101740353 A | 6/2010 |
| CN | 101924056 A | 12/2010 |
| EP | 1 889 887 A1 | 2/2008 |
| JP | 2004-063551 A | 2/2004 |
| JP | 2004-072108 A | 3/2004 |
| JP | 2004-142430 A | 5/2004 |
| JP | 2004-214288 A | 7/2004 |
| JP | 2004-221169 A | 8/2004 |
| JP | 2005-179496 A | 7/2005 |
| JP | 2007-158026 A | 6/2007 |
| JP | 2007-250970 A | 9/2007 |
| JP | 2007-261035 A | 10/2007 |
| JP | 2008-006386 A | 1/2008 |
| JP | 2008-166451 A | 7/2008 |
| JP | 2010-031183 | 2/2010 |
| JP | 2010-129701 A | 6/2010 |

OTHER PUBLICATIONS

Notification of Reasons for Refusal issued in corresponding JP Application No. 2010170919, dated Nov. 11, 2013.

* cited by examiner

THERMALLY RELEASABLE SHEET-INTEGRATED FILM FOR SEMICONDUCTOR BACK SURFACE, METHOD OF COLLECTING SEMICONDUCTOR ELEMENT, AND METHOD OF PRODUCING SEMICONDUCTOR DEVICE

FIELD OF THE INVENTION

The present invention relates to a thermally releasable sheet-integrated film for semiconductor back surface equipped with a film for semiconductor back surface. The film for semiconductor back surface is used in order to protect the back surface of a semiconductor element such as semiconductor chip, improve the strength of the back surface, and the like. The invention also relates to a collection method of a semiconductor element and a production method of a semiconductor device, each using the thermally releasable sheet-integrated film for semiconductor back surface.

BACKGROUND OF THE INVENTION

Recently, thinning and miniaturization of a semiconductor device and its package have been increasingly demanded. Therefore, as the semiconductor device and its package, flip chip type semiconductor devices in which a semiconductor element such as a semiconductor chip is mounted (flip chip-connected) on a substrate by means of flip chip bonding have been widely utilized. In such flip chip connection, a semiconductor chip is fixed to a substrate in a form where a circuit face of the semiconductor chip is opposed to an electrode-formed face of the substrate. In such a semiconductor device or the like, there may be a case where the back surface of the semiconductor chip is protected with a protective film to prevent the semiconductor chip from damaging or the like (see, Patent Document 1 to 10).

In order to protect the back surface of the semiconductor chip with the protective film, however, a new step for attaching the protective film to the back surface of a semiconductor chip obtained by a dicing step should be added. It results an increase in the number of the steps and a rise in the production cost and the like. With a view to reducing the production cost, a dicing tape-integrated film for semiconductor back surface has been developed. This dicing tape-integrated film for semiconductor back surface comprises a dicing tape having a pressure-sensitive adhesive layer provided on a base material and a film for flip chip type semiconductor back surface provided on the pressure-sensitive adhesive layer of the dicing tape. Upon producing a semiconductor device, this dicing tape-integrated film for semiconductor back surface is used in the following manner. First, a semiconductor wafer is attached onto a film for semiconductor back surface of the dicing tape-integrated film for semiconductor back surface. The resulting semiconductor wafer is then diced into semiconductor elements. After each of the semiconductor elements, together with the film for semiconductor back surface, is released from the pressure-sensitive adhesive layer of the dicing tape and picked up, the semiconductor element is flip chip connected onto an adherend such as substrate. In such a manner, a flip chip type semiconductor device can be obtained.

Patent Document 1: JP-A-2008-166451
Patent Document 2: JP-A-2008-006386
Patent Document 3: JP-A-2007-261035
Patent Document 4: JP-A-2007-250970
Patent Document 5: JP-A-2007-158026
Patent Document 6: JP-A-2004-221169
Patent Document 7: JP-A-2004-214288
Patent Document 8: JP-A-2004-142430
Patent Document 9: JP-A-2004-072108
Patent Document 10: JP-A-2004-063551

However, in the case of the above-mentioned dicing tape-integrated film for semiconductor back surface, when doss-adhesiveness between the pressure-sensitive adhesive layer and the film for semiconductor back surface is high, it becomes difficult to pick up the semiconductor element and in an extreme case, it may cause a production loss in some cases.

SUMMARY OF THE INVENTION

The invention has been made in consideration of the foregoing problem. An object thereof is to provide a thermally releasable sheet-integrated film for semiconductor back surface which facilitates release of a semiconductor element from a film for semiconductor back surface when the semiconductor element is picked up together with the film for semiconductor back surface and thereby can improve a production yield and production efficiency in the production of a semiconductor device; a collection method of a semiconductor element; and a production method of a semiconductor device.

The present inventors carried out investigations in order to solve the foregoing problem. As a result, it has been found that the problem can be overcome by employing the following constitution, leading to the completion of the invention.

Namely, the present invention provides a thermally releasable sheet-integrated film for semiconductor back surface (hereinafter may be referred to as "integrated film for semiconductor back surface"), which comprises: a pressure-sensitive adhesive sheet comprising a base material layer and a pressure-sensitive adhesive layer, and a film for semiconductor back surface formed on the pressure-sensitive adhesive layer of the pressure-sensitive adhesive sheet, wherein the pressure-sensitive adhesive sheet is a thermally releasable pressure-sensitive adhesive sheet whose peel force from the film for semiconductor back surface decreases upon heating.

When the integrated film for semiconductor back surface is used, since the pressure-sensitive adhesive sheet is a thermally releasable pressure-sensitive adhesive sheet (which will hereinafter be called "thermally releasable sheet") whose peel force from the film for semiconductor back surface decreases upon heating, only heating of the integrated film for semiconductor back surface prior to the pickup of a semiconductor element can raise the peelability between the thermally releasable sheet and the film for semiconductor back surface, thereby achieving a good pick-up property. In addition, reduction in peel force can be achieved only by simple treatment, that is, heating so that a production cost or cumbersome step for the production of a semiconductor device can be reduced.

The pressure-sensitive adhesive layer preferably includes a heat expandable layer containing heat expandable microspheres that expand upon heating. By using such a constitution, for example, upon picking up of a semiconductor element, the heat expandable microspheres expand merely by heating to thereby provide unevenness to the surface of the pressure-sensitive adhesive layer. The unevenness thus formed acts to separate the pressure-sensitive adhesive layer from the film for semiconductor back surface and doss-adhesiveness (peel force) therebetween decreases. As a result, good peelability can be achieved. The term "pressure-sensitive adhesive layer" as used herein means a concept embracing a pressure-sensitive adhesive layer composed only of the heat expandable layer.

The pressure-sensitive adhesive layer preferably further includes a non-heat expandable adherent layer formed on the heat expandable layer and between the heat expandable layer and the film for semiconductor back surface. Using such a constitution can prevent micro contaminants such as gas or organic matters, which have generated upon expansion of the heat expandable microspheres by heating, from transferring to the film for semiconductor back surface and contaminating it. When a semiconductor device is produced without removing the contaminants derived from the heat expandable microspheres, transferred to the film for semiconductor back surface, and remaining thereon, there sometimes occurs deterioration in appearance of the back surface of the semiconductor element (surface of the film for semiconductor back surface) or laser markability. Using the above-mentioned integrated film for semiconductor back surface can prevent contaminants derived from the heat expandable layer from transferring to the film for semiconductor back surface so that deterioration in appearance of the back surface of the semiconductor element or laser markability can be prevented.

When the starting temperature of thermal expansion of the heat expandable microspheres is 100° C. or greater, it is possible to prevent undesirable expansion of the heat expandable microspheres which will otherwise occur due to the heat applied to the thermally releasable sheet-integrated film for semiconductor back surface before the picking up step for the production of a semiconductor device, and thereby promoting efficient production of the semiconductor device.

When the heat expandable microspheres show a volume expansion of 5 times or greater, the close-adhesiveness between the pressure-sensitive adhesive layer of the thermally releasable sheet and the film for semiconductor back surface can be drastically reduced to further heighten the releasability and achieve further improvement in the picking-up property.

It is preferable that the pressure-sensitive adhesive sheet further includes a rubbery organic elastic layer between the base material layer and the heat expandable layer. The pressure-sensitive adhesive sheet having a rubbery organic elastic layer further can heighten the controllability of expansion of the heat expandable layer upon heating. In addition, it can expand the heat expandable layer in a thickness direction rather than in a surface direction to form an expanded layer excellent in uniform thickness. Even after expansion of the heat expandable layer, the rubbery organic elastic layer absorbs the unevenness so that release of the pressure-sensitive adhesive layer from the base material can be prevented.

The present invention also provides a method of collecting a semiconductor element, which comprises: attaching a semiconductor wafer onto the film for semiconductor back surface of the thermally releasable sheet-integrated film for semiconductor back surface mentioned above; dicing the semiconductor wafer to form a semiconductor element; heating the thermally releasable sheet-integrated film for semiconductor back surface; and releasing the semiconductor element together with the film for semiconductor back surface, from the pressure-sensitive adhesive layer of the thermally releasable sheet.

Thus, using the thermally releasable sheet-integrated film for semiconductor back surface as a means for fixing a semiconductor wafer upon dicing thereof enables precise and definite dicing of the semiconductor wafer because the film attaches to the semiconductor wafer firmly upon dicing and at the same time, the pressure-sensitive adhesive sheet can be easily separated from the film for semiconductor back surface due to reduction in peel force by heating upon collection of the semiconductor element. Semiconductor elements obtained through separation of the semiconductor wafer into semiconductor elements can therefore be collected easily and efficiently.

The present invention furthermore provides a method of producing a semiconductor device, which comprises flip-chip connecting, onto an adherend, a semiconductor element collected by the above-mentioned method of collecting a semiconductor element.

In the production method, the thermally releasable sheet-integrated film for semiconductor back surface is attached to the back surface of the semiconductor wafer so that a step of attaching only a film for semiconductor back surface (a step of attaching a film for semiconductor back surface) is not required. In addition, since the heating step of the thermally releasable sheet-integrated film for semiconductor back surface improves the releasability between the pressure-sensitive adhesive sheet and the film for semiconductor back surface, the semiconductor element can easily be picked up. Further, in dicing of the semiconductor wafer or picking up of the semiconductor element obtained using the dicing, the back surface of the semiconductor wafer or the semiconductor element is protected from the film for semiconductor back surface so that it is prevented from damage or the like. As a result, a flip chip type semiconductor device can be produced while improving the production yield thereof.

The thermally releasable sheet-integrated film for semiconductor back surface according to the invention is equipped with a thermally releasable sheet capable of reducing the peel force between the pressure-sensitive adhesive sheet and the film for semiconductor back surface merely by heating the releasable sheet-integreted film for semiconductor back surface prior to the picking up step of a semiconductor element, so that it can exhibit a good picking-up property and improve the production efficiency. Further, since the pressure-sensitive adhesive sheet as a dicing tape and a film for flip chip type semiconductor back surface are formed integrally, the integrated film for semiconductor back surface can be provided for a dicing step for dicing the semiconductor wafer into individual semiconductor elements and the picking-up step performed subsequently. As a result, a step of attaching only a film for semiconductor back surface (a step of attaching a film for semiconductor back surface) is not required. Moreover, in the dicing step or picking-up step conducted later, the film for semiconductor back surface attached to the back surface of the semiconductor wafer or the back surface of the semiconductor element formed through dicing protects the semiconductor wafer or semiconductor element and suppresses or prevents the element from damage.

After bonding the semiconductor element to a substrate or the like, the film for flip chip type semiconductor back surface can exhibit its function of protecting therewith the back surface of the semiconductor element.

Further, according to the collection method of a semiconductor element and the production method of a semiconductor device according to the invention, a step of attaching only a film for semiconductor back surface is not required because the thermally releasable sheet-integrated film for semiconductor back surface is attached to the back surface of a semiconductor wafer. In addition, in picking up of a semiconductor element, releasability of the pressure-sensitive adhesive sheet from the film for semiconductor back surface can be improved only by the heat treatment so that the semiconductor element and the film for semiconductor back surface can be collected in an integrated form without providing an additional step. Moreover, during dicing of the semiconductor wafer or picking up of the semiconductor element obtained through the dicing, the back surface of the semiconductor wafer or the semiconductor element protected with the film for semiconductor back surface can be prevented from damage or the like. Thus, it is possible to produce a flip chip type semiconductor device efficiently while improving the production yield.

DESCRIPTION OF REFERENCE NUMERALS AND SIGNS

1 Thermally Releasable Sheet-Integrated Film for Semiconductor Back Surface
2 Film for Semiconductor Back Surface
3 Pressure-Sensitive Adhesive sheet (Thermally releasable Sheet)
31 Base Material
32 Pressure-Sensitive Adhesive Layer
32a Heat Expandable Layer
32b Adherent Layer
33 Portion Corresponding to Portion to Which Semiconductor Wafer is attached
4 Semiconductor Wafer
5 Semiconductor Chip
51 Bump Formed on Circuit Surface Side of Semiconductor Chip 5
6 Adherend
61 Conductive Material for Junction Attached to Connection Pad of Adherend 6

BEST MODE FOR CARRYING OUT THE INVENTION

Figure 1:
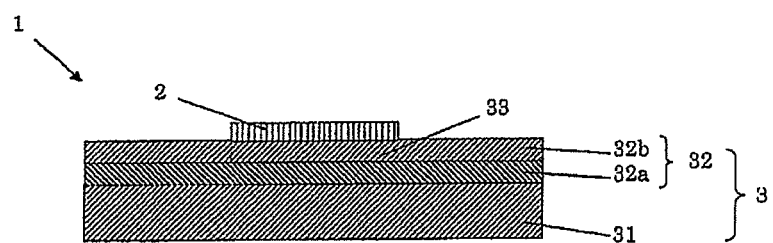
FIG. 1 is a schematic cross-sectional view showing one example of the thermally releasable sheet-integrated film for semiconductor back surface according to the invention.
Figure 2:
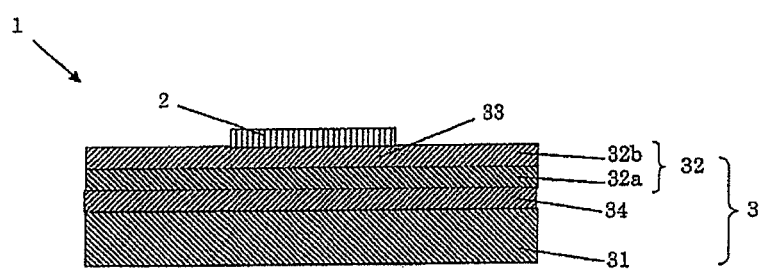
FIG. 2 is a schematic cross-sectional view showing another example of the thermally releasable sheet-integrated film for semiconductor back surface according to the invention.

Embodiments of the invention will next be described referring to FIGS. 1 and 2, but the invention is not limited to or by these embodiments. FIG. 1 is a schematic cross-sectional view showing one example of the thermally releasable sheet-integrated film for semiconductor back surface according to the present embodiment and FIG. 2 is a schematic cross-sectional view showing another example of the thermally releasable sheet-integrated film for semiconductor back surface according to the present embodiment. Incidentally, in the drawings shown therein, portions not necessary for the description may be omitted and some portions may be magnified, reduced, or the like to facilitate description.
(Thermally Releasable Sheet-Integrated Film for Semiconductor Back Surface)

As shown in FIG. 1, a thermally releasable sheet-integrated film for semiconductor back surface 1 (hereinafter sometimes also referred to as "thermally releasable sheet-integrated semiconductor back surface protective film", "film for semiconductor back surface with thermally releasable sheet", or "semiconductor back surface protective film with thermally releasable sheet") includes a pressure-sensitive adhesive sheet 3 including a base material 31 and a pressure-sensitive adhesive layer 32 provided on the base material 31, and a film for flip chip type semiconductor back surface 2 (hereinafter sometimes referred to as "film for semiconductor back surface" or "semiconductor back surface protective film") provided on the pressure-sensitive adhesive layer 32. The thermally releasable sheet-integrated film for semiconductor back surface 1 uses, as the pressure-sensitive adhesive sheet 3, a thermally releasable pressure-sensitive adhesive sheet (thermally releasable sheet) whose peel force between the pressure-sensitive adhesive layer 32 and the film for semiconductor back surface 2 decreases by heating. In the integrated film for semiconductor back surface 1 according to the present embodiment, the pressure-sensitive adhesive layer 32 has, as will be described specifically later, a heat expandable layer 32a containing heat expandable microspheres that expand by heating and a non-heat expandable adherent layer 32b formed on the heat expandable layer 32a.

The thermally releasable sheet-integrated film for semiconductor back surface according to the invention may have, as illustrated in FIG. 1, a film for semiconductor back surface 2 only on a portion 33, of the adherent layer 32b of the thermally releasable sheet 3, corresponding to a portion to which a semiconductor wafer is attached, but may have the film for semiconductor back surface 2 on the entire surface of the adherent layer 32b, or may have the film for semiconductor back surface on a portion greater than the portion 33 to which a semiconductor wafer is to be attached but smaller than the entire surface of the adherent layer 32b. The surface of the film 2 for semiconductor back surface (surface of the film on the side to be attached to the back surface of the wafer) may be protected with a separator or the like until the film is attached to the back surface of the wafer.
(Film for Semiconductor Back Surface)

The film for semiconductor back surface 2 has a film shape. The film for semiconductor back surface 2 is usually in an uncured state (including a semi-cured state) in the embodiment of the thermally releasable sheet-integrated film for semiconductor back surface as a product and is thermally cured after the thermally releasable sheet-integrated film for semiconductor back surface is attached to the semiconductor wafer (details are described below). Herein, the film for semiconductor back surface may be a monolayer or a laminated film composed of a plurality of layers.

The film for semiconductor back surface 2 according to the present embodiment can be formed using a resin composition. It is preferably composed of a resin composition containing a thermoplastic resin and a thermosetting resin. The film for semiconductor back surface containing the thermosetting resin can effectively exhibit a function as an adhesive layer. Further, the resin composition may contain a thermal curing-accelerating catalyst. The resin composition may be composed of a thermoplastic resin composition free of a thermosetting resin or may be composed of a thermosetting resin composition free of a thermoplastic resin.

Examples of the thermoplastic resin include natural rubber, butyl rubber, isoprene rubber, chloroprene rubber, an ethylene-vinyl acetate copolymer, an ethylene-acrylic acid copolymer, an ethylene-acrylic acid ester copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET (polyethylene terephthalate) or PBT (polybutylene terephthalate), a polyamideimide resin, or a fluorine resin. The thermoplastic resin may be employed singly or in a combination of two or more kinds. Among these thermoplastic resins, an acrylic resin containing a small amount of ionic impurities, having high heat resistance and capable of securing reliability of a semiconductor element is especially preferable.

The acrylic resins are not particularly restricted, and examples thereof include polymers containing one kind or two or more kinds of esters of acrylic acid or methacrylic acid having a straight chain or branched alkyl group having 30 or less carbon atoms, preferably 4 to 18 carbon atoms, more preferably 6 to 10 carbon atoms, and especially 8 or 9 carbon atoms as component(s). Namely, in the invention, the acrylic resin has a broad meaning also including a methacrylic resin. Examples of the alkyl group include a methyl group, an ethyl group, a propyl group, an isopropyl group, an n-butyl group, a t-butyl group, an isobutyl group, a pentyl group, an isopentyl group, a hexyl group, a heptyl group, a 2-ethylhexyl group, an octyl group, an isooctyl group, a nonyl group, an isononyl group, a decyl group, an isodecyl group, an undecyl group, a dodecyl group (lauryl group), a tridecyl group, a tetradecyl group, a stearyl group, and an octadecyl group.

Moreover, other monomers for forming the acrylic resins (monomers other than the alkyl esters of acrylic acid or methacrylic acid in which the alkyl group is one having 30 or less carbon atoms) are not particularly restricted, and examples thereof include carboxyl group-containing monomers such as acrylic acid, methacrylic acid, carboxylethyl acrylate, carboxylpentyl acrylate, itaconic acid, maleic acid, fumaric acid, and crotonic acid; acid anhydride monomers such as maleic anhydride and itaconic anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate; sulfonic acid group-containing monomers such as styrenesulfonic acid, allylsulfonic acid, 2-(meth)acrylamido-2-methylpropanesulfonic acid, (meth)acrylamidopropanesulfonic acid, sulfopropyl (meth)acrylate, and (meth)acryloyloxynaphthalenesulfonic acid; and phosphoric acid group-containing monomers such as 2-hydroxyethylacryloyl phosphate. In this regard, the (meth)acrylic acid means acrylic acid and/or methacrylic acid, (meth)acrylate means acrylate and/or methacrylate, (meth)acryl means acryl and/or methacryl, etc., which shall be applied over the whole specification.

Moreover, examples of the thermosetting resin include, in addition to an epoxy resin and a phenol resin, an amino resin, an unsaturated polyester resin, a polyurethane resin, a silicone resin and a thermosetting polyimide resin. The thermosetting resin may be employed singly or in a combination of two or more kinds. As the thermosetting resin, an epoxy resin containing only a small amount of ionic impurities which corrode a semiconductor element is suitable. Also, the phenol resin is suitably used as a curing agent of the epoxy resins.

The epoxy resin is not particularly restricted and, for example, a difunctional epoxy resin or a polyfunctional epoxy resin such as a bisphenol A type epoxy resin, a bisphenol F type epoxy resin, a bisphenol S type epoxy resin, a brominated bisphenol A type epoxy resin, a hydrogenated bisphenol A type epoxy resin, a bisphenol AF type epoxy resin, a biphenyl type epoxy resin, a naphthalene type epoxy resin, a fluorene type epoxy resin, a phenol novolak type epoxy resin, an o-cresol novolak type epoxy resin, a trishydroxyphenylmethane type epoxy resin and a tetraphenylolethane type epoxy resin, or an epoxy resin such as a hydantoin type epoxy resin, a trisglycidylisocyanurate type epoxy resin or a glycidylamine type epoxy resin may be used.

As the epoxy resin, among those exemplified above, a novolak type epoxy resin, a biphenyl type epoxy resin, a trishydroxyphenylmethane type epoxy resin, and a tetraphenylolethane type epoxy resin are preferable. This is because these epoxy resins have high reactivity with a phenol resin as a curing agent and are superior in heat resistance and the like.

Furthermore, the above-mentioned phenol resin acts as a curing agent of the epoxy resin, and examples thereof include novolak type phenol resins such as phenol novolak resins, phenol aralkyl resins, cresol novolak resins, tert-butylphenol novolak resins, and nonylphenol novolak resins; resol type phenol resins; and polyoxystyrenes such as poly-p-oxystyrene. The phenol resin may be employed singly or in a combination of two or more kinds. Among these phenol resins, phenol novolak resins and phenol aralkyl resins are especially preferable. This is because connection reliability of the semiconductor device can be improved.

The mixing ratio of the epoxy resin to the phenol resin is preferably made, for example, such that the hydroxyl group in the phenol resin becomes 0.5 to 2.0 equivalents per equivalent of the epoxy group in the epoxy resin component. It is more preferably 0.8 to 1.2 equivalents. That is, when the mixing ratio becomes outside the range, a curing reaction does not proceed sufficiently, and the characteristics of the epoxy resin cured product tends to deteriorate.

The content of the thermosetting resin is preferably from 40% by weight to 90% by weight, more preferably from 50% by weight to 90% by weight, even more preferably from 60% by weight to 90% by weight, relative to all the resin components in the film for semiconductor back surface. When the content is at least 40% by weight, then the thermosetting shrinkage may be readily controlled to be at least 2% by volume. In flip chip mounting, a mold resin to encapsulate the entire semiconductor package is not used but in general, the bump connecting part alone between the adherend and the semiconductor element is encapsulated with an encapsulating resin called an underfill material. When the film for semiconductor back surface contains the resin in the amount mentioned above, the film can be fully thermo-cured during thermal curing of the encapsulating resin, and the film can be surely adhered and fixed to the back surface of a semiconductor element to give a flip chip type semiconductor device with no film peeling therein. On the other hand, when the content is at most 90% by weight, then the film may be flexible.

Not specifically defined, the thermal curing-accelerating catalyst may be suitably selected from known thermal curing-accelerating catalysts. One or more thermal curing-accelerating catalysts may be used here either singly or as combined. As the thermal curing-accelerating catalyst, for example, an amine-based curing-accelerating catalyst, a phosphorus-based curing-accelerating catalyst, an imidazole-based curing-accelerating catalyst, a boron-based curing-accelerating catalyst, or a phosphorus-boron-based curing-accelerating catalyst can be used.

The film for semiconductor back surface is particularly suitably formed of a resin composition containing an epoxy resin and a phenolic resin or a resin composition containing an epoxy resin, a phenolic resin, and an acrylic resin. Since these resins contain only a small amount of ionic impurities and have high heat resistance, reliability of semiconductor elements can be secured.

It is important that the film for semiconductor back surface 2 has adhesiveness (close adhesiveness) to the back surface (non-circuit-formed face) of semiconductor wafer. For example, in the case where the film for semiconductor back surface 2 is formed of a resin composition containing an epoxy resin as a thermosetting resin component, in order to cure the film for semiconductor back surface 2 beforehand to some degree, at its preparation, it is preferable to add a polyfunctional compound capable of reacting with the functional group or the like at the molecular chain end of the polymer as a crosslinking agent. Thereby, adhesive characteristics under high temperature can be enhanced and improvement of the heat resistance of the film can be achieved.

The adhesive force of the film for semiconductor back surface to semiconductor wafer (23° C., peeling angle of 180 degrees, peeling rate of 300 mm/min) is preferably within a range of from 0.5 N/20 mm to 15 N/20 mm, more preferably from 0.7 N/20 mm to 10 N/20 mm. When the adhesive force is at least 0.5 N/20 mm, then the film can be adhered to semiconductor wafer and semiconductor element with excellent adhesiveness and is free from film swelling or the like adhesion failure. In addition, in dicing of semiconductor wafer, the chips can be prevented from flying out. On the other hand, when the adhesive force is at most 15 N/20 mm, then it facilitates peeling from the thermally releasable sheet.

The crosslinking agent is not particularly restricted and known crosslinking agents can be used. Specifically, for example, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned. As the crosslinking agent, an isocyanate-based crosslinking agent or an epoxy-based crosslinking agent is suitable. The crosslinking agent may be employed singly or in a combination of two or more kinds.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl) isocyanurate, resorcin diglycidyl ether, and bisphenol-S-diglycidyl ether, and also epoxy-based resins having two or more epoxy groups in the molecule.

The amount of the crosslinking agent to be used is not particularly restricted and can be appropriately selected depending on the degree of the crosslinking. Specifically, it is preferable that the amount of the crosslinking agent to be used is usually 7 parts by weight or less (for example, 0.05 to 7 parts by weight) based on 100 parts by weight of the polymer component (particularly, a polymer having a functional group at the molecular chain end). When the amount of the crosslinking agent is larger than 7 parts by weight based on 100 parts by weight of the polymer component, the adhesive force is lowered, so that the case is not preferred. From the viewpoint of improving the cohesive force, the amount of the crosslinking agent is preferably 0.05 parts by weight or more based on 100 parts by weight of the polymer component.

In the invention, instead of the use of the crosslinking agent or together with the use of the crosslinking agent, it is also possible to perform a crosslinking treatment by irradiation with an electron beam, UV light, or the like.

The film for semiconductor back surface is preferably colored. Thereby, an excellent laser marking property and an excellent appearance property can be exhibited, and it becomes possible to make a semiconductor device having a value-added appearance property. As above, since the colored film for semiconductor back surface has an excellent marking property, marking can be performed to impart various kinds of information such as literal information and graphical information to the face on the non-circuit side of the semiconductor element or a semiconductor device using the semiconductor element by utilizing any of various marking methods such as a printing method and a laser marking method through the film of semiconductor back surface. Particularly, by controlling the color of coloring, it becomes possible to observe the information (for example, literal information and graphical information) imparted by marking with excellent visibility. Moreover, when the film for semiconductor back surface is colored, the thermally releasable sheet and the film for semiconductor back surface can be easily distinguished from each other, so that workability and the like can be enhanced. Furthermore, for example, as a semiconductor device, it is possible to classify products thereof by using different colors. In the case where the film for semiconductor back surface is colored (the case where the film is neither colorless nor transparent), the color shown by coloring is not particularly limited but, for example, is preferably dark color such as black, blue or red color, and black color is especially suitable.

In the present embodiment, dark color basically means a dark color having L*, defined in L*a*b* color space, of 60 or smaller (0 to 60), preferably 50 or smaller (0 to 50), and more preferably 40 or smaller (0 to 40).

Moreover, black color basically means a black-based color having L*, defined in L*a*b* color space, of 35 or smaller (0 to 35), preferably 30 or smaller (0 to 30), and more preferably 25 or smaller (0 to 25). In this regard, in the black color, each of a* and b*, defined in the L*a*b* color space, can be suitably selected according to the value of L*. For example, both of a* and b* are within the range of preferably −10 to 10, more preferably −5 to 5, and further preferably −3 to 3 (particularly 0 or about 0).

In the present embodiment, L*, a*, and b* defined in the L*a*b* color space can be determined by a measurement with a color difference meter (a trade name "CR-200" manufactured by Minolta Ltd; color difference meter). The L*a*b* color space is a color space recommended by the Commission Internationale de l'Eclairage (CIE) in 1976, and means a color space called CIE1976(L*a*b*) color space. Also, the L*a*b* color space is defined in Japanese Industrial Standards in JIS Z8729.

At coloring of the film for semiconductor back surface, according to an objective color, a colorant (coloring agent) can be used. As such a colorant, various dark-colored colorants such as black-colored colorants, blue-colored colorants, and red-colored colorants can be suitably used and black-colored colorants are more suitable. The colorant may be any of pigments and dyes. The colorant may be employed singly or in combination of two or more kinds. In this regard, as the dyes, it is possible to use any forms of dyes such as acid dyes, reactive dyes, direct dyes, disperse dyes, and cationic dyes. Moreover, also with regard to the pigments, the form thereof is not particularly restricted and can be suitably selected and used among known pigments.

In particular, when a dye is used as a colorant, the dye becomes in a state that it is homogeneously or almost homogeneously dispersed by dissolution in the film for semiconductor back surface, so that the film for semiconductor back surface (as a result, the thermally releasable sheet-integrated film for semiconductor back surface) having a homogeneous or almost homogeneous color density can be easily produced. Accordingly, when a dye is used as a colorant, the film for semiconductor back surface in the thermally releasable sheet-integrated film for semiconductor back surface can have a homogeneous or almost homogeneous color density and can enhance a marking property and an appearance property.

The black-colored colorant is not particularly restricted and can be, for example, suitably selected from inorganic black-colored pigments and black-colored dyes. Moreover, the black-colored colorant may be a colorant mixture in which a cyan-colored colorant (blue-green colorant), a magenta-colored colorant (red-purple colorant), and a yellow-colored colorant (yellow colorant) are mixed. The black-colored colorant may be employed singly or in a combination of two or more kinds. Of course, the black-colored colorant may be used in combination with a colorant of a color other than black.

Specific examples of the black-colored colorant include carbon black (such as furnace black, channel black, acetylene black, thermal black, or lamp black), graphite, copper oxide, manganese dioxide, azo-type pigments (such as azomethine azo black), aniline black, perylene black, titanium black, cyanine black, active charcoal, ferrite (such as non-magnetic ferrite or magnetic ferrite), magnetite, chromium oxide, iron oxide, molybdenum disulfide, a chromium complex, a composite oxide type black pigment, and an anthraquinone type organic black pigment.

In the invention, as the black-colored colorant, black-colored dyes such as C.I. Solvent Black 3, 7, 22, 27, 29, 34, 43, 70, C.I. Direct Black 17, 19, 22, 32, 38, 51, 71, C.I. Acid Black 1, 2, 24, 26, 31, 48, 52, 107, 109, 110, 119, 154, and C.I. Disperse Black 1, 3, 10, 24; black-colored pigments such as C.I. Pigment Black 1, 7; and the like can also be utilized.

As such black-colored colorants, for example, a trade name "Oil Black BY", a trade name "Oil Black BS", a trade name "Oil Black HBB", a trade name "Oil Black 803", a trade name "Oil Black 860", a trade name "Oil Black 5970", a trade name "Oil Black 5906", a trade name "Oil Black 5905" (manufactured by Orient Chemical Industries Co., Ltd.), and the like are commercially available.

Examples of colorants other than the black-colored colorant include cyan-colored colorants, magenta-colored colorants, and yellow-colored colorants. Examples of the cyan-colored colorants include cyan-colored dyes such as C.I. Solvent Blue 25, 36, 60, 70, 93, 95; C.I. Acid Blue 6 and 45; cyan-colored pigments such as C.I. Pigment Blue 1, 2, 3, 15, 15:1, 15:2, 15:3, 15:4, 15:5, 15:6, 16, 17, 17:1, 18, 22, 25, 56, 60, 63, 65, 66; C.I. Vat Blue 4, 60; and C.I. Pigment Green 7.

Moreover, among the magenta colorants, examples of magenta-colored dye include C.I. Solvent Red 1, 3, 8, 23, 24, 25, 27, 30, 49, 52, 58, 63, 81, 82, 83, 84, 100, 109, 111, 121, 122; C.I. Disperse Red 9; C.I. Solvent Violet 8, 13, 14, 21, 27; C.I. Disperse Violet 1; C.I. Basic Red 1, 2, 9, 12, 13, 14, 15, 17, 18, 22, 23, 24, 27, 29, 32, 34, 35, 36, 37, 38, 39, 40; C.I. Basic Violet 1, 3, 7, 10, 14, 15, 21, 25, 26, 27 and 28.

Among the magenta-colored colorants, examples of magenta-colored pigment include C.I. Pigment Red 1, 2, 3, 4, 5, 6, 7, 8, 9, 10, 11, 12, 13, 14, 15, 16, 17, 18, 19, 21, 22, 23, 30, 31, 32, 37, 38, 39, 40, 41, 42, 48:1, 48:2, 48:3, 48:4, 49, 49:1, 50, 51, 52, 52:2, 53:1, 54, 55, 56, 57:1, 58, 60, 60:1, 63, 63:1, 63:2, 64, 64:1, 67, 68, 81, 83, 87, 88, 89, 90, 92, 101, 104, 105, 106, 108, 112, 114, 122, 123, 139, 144, 146, 147, 149, 150, 151, 163, 166, 168, 170, 171, 172, 175, 176, 177, 178, 179, 184, 185, 187, 190, 193, 202, 206, 207, 209, 219, 222, 224, 238, 245; C.I. Pigment Violet 3, 9, 19, 23, 31, 32, 33, 36, 38, 43, 50; C.I. Vat Red 1, 2, 10, 13, 15, 23, 29 and 35.

Moreover, examples of the yellow-colored colorants include yellow-colored dyes such as C.I. Solvent Yellow 19, 44, 77, 79, 81, 82, 93, 98, 103, 104, 112, and 162; yellow-colored pigments such as C.I. Pigment Orange 31, 43; C.I. Pigment Yellow 1, 2, 3, 4, 5, 6, 7, 10, 11, 12, 13, 14, 15, 16, 17, 23, 24, 34, 35, 37, 42, 53, 55, 65, 73, 74, 75, 81, 83, 93, 94, 95, 97, 98, 100, 101, 104, 108, 109, 110, 113, 114, 116, 117, 120, 128, 129, 133, 138, 139, 147, 150, 151, 153, 154, 155, 156, 167, 172, 173, 180, 185, 195; C.I. Vat Yellow 1, 3, and 20.

Various colorants such as cyan-colored colorants, magenta-colored colorants, and yellow-colorant colorants may be employed singly or in a combination of two or more kinds, respectively. In this regard, in the case where two or more kinds of various colorants such as cyan-colored colorants, magenta-colored colorants, and yellow-colorant colorants are used, the mixing ratio (or blending ratio) of these colorants is not particularly restricted and can be suitably selected according to the kind of each colorant, an objective color, and the like.

In the case where the film for semiconductor back surface 2 is colored, the colored form is not particularly restricted. The film for semiconductor back surface may be, for example, a single-layer film-shaped article added with a coloring agent. Moreover, the film may be a laminated film where a resin layer formed of at least a thermosetting resin and a coloring agent layer are at least laminated. In this regard, in the case where the film for semiconductor back surface 2 is a laminated film of the resin layer and the coloring agent layer, the film for semiconductor back surface 2 in the laminated form preferably has a laminated form of a resin layer/a coloring agent layer/a resin layer. In this case, two resin layers at both sides of the coloring agent layer may be resin layers having the same composition or may be resin layers having different composition.

Into the film for semiconductor back surface 2, other additives can be suitably blended according to the necessity. Examples of the other additives include an extender, an anti-aging agent, an antioxidant, and a surfactant, in addition to a filler, a flame retardant, a silane-coupling agent, and an ion-trapping agent.

The filler may be any of an inorganic filler and an organic filler, but is preferably an inorganic filler. Incorporating the other filler such as an inorganic filler thereinto makes it possible to impart electroconductivity to the film for semiconductor back surface, to enhance the thermal conductivity of the film and to control the elasticity of the film. The film 2 for semiconductor back surface may be electroconductive or non-electroconductive. The inorganic filler includes various inorganic powders of, for example, ceramics such as silica, clay, gypsum, calcium carbonate, barium sulfate, beryllium oxide; metals such as aluminium, copper, silver, gold, nickel, chromium, lead, tin, zinc, palladium, solder; their alloys and other carbon. One or more such fillers may be used here either singly or as combined. As the filler, preferred is silica, and more preferred is fused silica. Preferably, the average particle size of the inorganic filler is within a range of from 0.1 µm to 80 µm. In the present specification, the average particle size of the inorganic filler is determined with a laser diffraction particle sizer.

The blending amount of the filler (in particular, inorganic filler) is preferably 80 parts by weight or less (0 part by weight to 80 parts by weight) and more preferably 0 part by weight to 70 parts by weight based on 100 parts by weight of the organic resin components.

Examples of the flame retardant include antimony trioxide, antimony pentoxide, and brominated epoxy resins. The flame retardant may be employed singly or in a combination of two or more kinds. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. The silane coupling agent may be employed singly or in a combination of two or more kinds. Examples of the ion-trapping agent include hydrotalcites and bismuth hydroxide. The ion-trapping agent may be employed singly or in a combination of two or more kinds.

The film for semiconductor back surface 2 can be, for example, formed by utilizing a commonly used method including mixing a thermosetting resin such as an epoxy resin and, if necessary, a thermoplastic resin such as an acrylic resin and optional solvent and other additives to prepare a resin composition, followed by forming it to a film-shaped layer. Specifically, a film-shaped layer (adhesive layer) as the film for semiconductor back surface can be formed, for example, by a method including applying the resin composition on the pressure-sensitive adhesive layer 32 of the thermally releasable sheet; a method including applying the resin composition on an appropriate separator (such as release paper) to form a resin layer (or an adhesive layer) and then transferring (transcribing) it on the pressure-sensitive adhesive layer 32; or the like. In this regard, the resin composition may be a solution or a dispersion.

Incidentally, in the case where the film for semiconductor back surface 2 is formed of a resin composition containing a thermosetting resin such as an epoxy resin, the film for semiconductor back surface is in a state that the thermosetting resin is uncured or partially cured at a stage before the film is applied to a semiconductor wafer. In this case, after it is applied to the semiconductor wafer (specifically, usually, at the time when the encapsulating material is cured in the flip chip bonding step), the thermosetting resin in the film for semiconductor back surface is completely or almost completely cured.

As above, since the film for semiconductor back surface is in a state that the thermosetting resin is uncured or partially cured even when the film contains the thermosetting resin, the gel fraction of the film for semiconductor back surface is not particularly restricted but is, for example, suitably selected from the range of 50% by weight or less (0 to 50% by weight) and is preferably 30% by weight or less (0 to 30% by weight) and particularly preferably 10% by weight or less (0 to 10% by weight). The gel fraction of the film for semiconductor back surface can be measured by the following measuring method.

<Gel Fraction Measuring Method>

About 0.1 g of a sample is sampled from the film for semiconductor back surface 2 and precisely weighed (weight of sample) and, after the sample is wrapped in a mesh-type sheet, it is immersed in about 50 mL of toluene at room temperature for 1 week. Thereafter, a solvent-insoluble matter (content in the mesh-type sheet) is taken out of the toluene and dried at 130° C. for about 2 hours, the solvent-insoluble matter after drying is weighed (weight after immersion and drying), and a gel fraction (% by weight) is then calculated according to the following expression (a).

$$\text{Gel fraction (\% by weight)} = [(\text{Weight after immersion and Drying})/(\text{Weight of sample})] \times 100 \quad (a)$$

The gel fraction of the film for semiconductor back surface can be controlled by the kind and content of the resin components and the kind and content of the crosslinking agent and besides, heating temperature, heating time and the like.

In the invention, in the case where the film for semiconductor back surface is a film-shaped article formed of a resin composition containing a thermosetting resin such as an epoxy resin, close adhesiveness to a semiconductor wafer can be effectively exhibited.

Incidentally, since cutting water is used in the dicing step of the semiconductor wafer, the film for semiconductor back surface absorbs moisture to have a moisture content of a normal state or more in some cases. When flip chip bonding is performed with still maintaining such a high moisture content, water vapor remains at the adhesion interface between the film for semiconductor back surface and the semiconductor wafer or its processed body (semiconductor) and lifting is generated in some cases. Therefore, by constituting the film for semiconductor back surface as a configuration in which a core material having a high moisture permeability is provided on each surface thereof, water vapor diffuses and thus it becomes possible to avoid such a problem. From such a viewpoint, a multilayered structure in which the film for semiconductor back surface is formed at one surface or both surfaces of the core material may be used as the film for semiconductor back surface. Examples of the core material include films (e.g., polyimide films, polyester films, polyethylene terephthalate films, polyethylene naphthalate films, polycarbonate films, etc.), resin substrates reinforced with a glass fiber or a plastic nonwoven fiber, silicon substrates, and glass substrates.

The thickness (total thickness in the case of the laminated film) of the film for semiconductor back surface 2 is not particularly restricted but can be, for example, suitably selected from the range of about 2 µm to 200 µm. Furthermore, the thickness is preferably about 4 µm to 160 µm, more preferably about 6 µm to 100 µm, and particularly about 10 µm to 80 µm.

The tensile storage elastic modulus of the film for semiconductor back surface 2 in an uncured state at 23° C. is preferably 1 GPa or more (e.g., 1 GPa to 50 GPa), more preferably 2 GPa or more, and particularly, 3 GPa or more is suitable. When the tensile storage elastic modulus is 1 GPa or more, the attachment of the film for semiconductor back surface to a support can be effectively suppressed or prevented at the time when the film for semiconductor back surface 2 is placed on the support and transportation and the like are performed after the semiconductor chip is peeled from the pressure-sensitive adhesive layer 32 of the thermally releasable sheet together with the film for semiconductor back surface 2. In this regard, the support is, for example, a top tape, a bottom tape, and the like in a carrier tape. In the case where the film for semiconductor back surface 2 is formed of a resin composition containing a thermosetting resin, as mentioned above, the thermosetting resin is usually in a uncured or partially cured state, so that the tensile storage elastic modulus of the film for semiconductor back surface at 23° C. is a tensile storage elastic modulus at 23° C. in a state that the thermosetting resin is uncured or partially cured.

Here, the film for semiconductor back surface 2 may be either a single layer or a laminated film where a plurality of layers are laminated. In the case of the laminated film, the tensile storage elastic modulus is sufficiently 1 GPa or more (e.g., 1 GPa to 50 GPa) as the whole laminated film in an uncured state. Also the tensile storage elastic modulus (23° C.) of the film for semiconductor back surface in an uncured state can be controlled by suitably setting up the kind and content of the resin components (thermoplastic resin and/or thermosetting resin) or the kind and content of a filler such as a silica filler. In the case where the film for semiconductor back surface 2 is a laminated film where a plurality of layers are laminated (in the case where the film for semiconductor back surface has a form of the laminated layer), as the laminated layer form, for example, a laminated form composed of a wafer adhesive layer and a laser marking layer can be exemplified. Moreover, between the wafer adhesive layer and the laser marking layer, other layers (an intermediate layer, a light-shielding layer, a reinforcing layer, a colored layer, a base material layer, an electromagnetic wave-shielding layer, a heat conductive layer, a pressure-sensitive adhesive layer, etc.) may be provided. In this regard, the wafer adhesive layer is a layer which exhibits an excellent close adhesiveness (adhesive property) to a wafer and a layer which comes into contact with the back surface of a wafer. On the other hand, the laser marking layer is a layer which exhibits an excellent laser marking property and a layer which is utilized at the laser marking on the back surface of a semiconductor chip.

The tensile storage elastic modulus is determined by preparing the film for semiconductor back surface 2 in an uncured state without lamination onto the pressure-sensitive adhesive sheet (thermally releasable sheet) 3 and measuring elastic modulus in a tensile mode under conditions of a sample width of 10 mm, a sample length of 22.5 mm, a sample thickness of 0.2 mm, a frequency of 1 Hz, and a temperature elevating rate of 10° C./minute under a nitrogen atmosphere at a prescribed temperature (23° C.) using a dynamic viscoelasticity measuring apparatus "Solid Analyzer RS A2" manufactured by Rheometrics Co. Ltd. and the measured elastic modulus is regarded as a value of tensile storage elastic modulus obtained.

The film for semiconductor back surface 2 is preferably protected, on the surface thereof opposite to the surface facing the thermally releasable sheet, with a separator (release liner) (not illustrated). The separator has a function as a protecting material of the film for semiconductor back surface until actual use. In the case of the thermally releasable sheet-integrated film for semiconductor back surface 1, the separator can be used also as a supporting base material when the film for semiconductor back surface 2 is transferred to the pressure-sensitive adhesive layer 32 (or adherent layer 32*b*) on the base material 31 of the thermally releasable sheet 3. The separator is released when a semiconductor wafer is attached onto the film for semiconductor back surface. Usable examples of the separator include polyethylene film, polypropylene film, and a plastic film (such as polyethylene terephthalate) and paper having a surface coated with a release agent such as fluorine-based release agent or long-chain alkyl acrylate-based release agent. Incidentally, the separator can be formed using a conventionally known process. No particular limitation is imposed on the thickness or the like of the separator.

Moreover, the light transmittance with a visible light (visible light transmittance, wavelength: 380 to 750 nm) in the film for semiconductor back surface 2 is not particularly restricted but is, for example, preferably in the range of 20% or less (0 to 20%), more preferably 10% or less (0 to 10%), and particularly preferably 5% or less (0 to 5%). When the film for semiconductor back surface 2 has a visible light transmittance of more than 20%, there is a concern that the transmission of the light may adversely influence the semiconductor element. The visible light transmittance (%) can be controlled by the kind and content of the resin components of the film for semiconductor back surface 2, the kind and content of the coloring agent (such as pigment or dye), the content of the inorganic filer, and the like.

The visible light transmittance (%) of the film for semiconductor back surface 2 can be determined as follows. Namely, a film for semiconductor back surface 2 having a thickness (average thickness) of 20 μm itself is prepared. Then, the film for semiconductor back surface 2 is irradiated with a visible light having a wavelength of 380 to 750 nm in a prescribed intensity [apparatus: a visible light generating apparatus manufactured by Shimadzu Corporation [trade name "ABSORPTION SPECTRO PHOTOMETER"], and the intensity of transmitted visible light is measured. Further, the visible light transmittance (%) can be determined based on intensity change before and after the transmittance of the visible light through the film for semiconductor back surface 2. In this regard, it is also possible to derive visible light transmittance (%; wavelength: 380 to 750 nm) of the film for semiconductor back surface 2 having a thickness of 20 μm from the value of the visible light transmittance (%; wavelength: 380 to 750 nm) of the film for semiconductor back surface 2 whose thickness is not 20 μm. In the invention, the visible light transmittance (%) is determined in the case of the film for semiconductor back surface 2 having a thickness of 20 μm, but the film for semiconductor back surface according to the invention is not limited to one having a thickness of 20 μm.

In the invention, the contrast after laser printing is preferably higher from the standpoint of visibility. In the invention, based on the brightness of a processed portion and that of an unprocessed portion measured by means of "CV-5000" (trade name; product of KEYENCE CORPORATION), the contrast can be determined in accordance with the following formula:

Contrast=[(brightness of a processed portion−brightness of an unprocessed portion)/(brightness of a processed portion)]×100(%)

The contrast after laser printing is preferably 20% or greater, more preferably 25% or greater (particularly preferably 30%) from the standpoint of the visibility at the laser processed portion.

A production process of a semiconductor device includes a step of mounting a substrate and a semiconductor element or an element mounted on a substrate on a main substrate called "mother board". An electrode connecting method in this mounting step is conducted in a reflow step in which heat treatment at approximately from 230° C. to 280° C. is usually performed. With a view to maintaining a visibility level or laser printability after the reflow step, a reduction ratio of the contrast in the reflow step is preferably 15% or less. To keep a good visibility level at the laser printed portion, the reduction rate is more preferably 10% or less (especially preferably 5% or less).

Moreover, as the film for semiconductor back surface 2, one having lower moisture absorbance is more preferred. Specifically, the moisture absorbance is preferably 1% by weight or less and more preferably 0.8% by weight or less. By regulating the moisture absorbance to 1% by weight or less, the laser marking property can be enhanced. Moreover, for example, the generation of voids between the film for semiconductor back surface 2 and the semiconductor element can be suppressed or prevented in the reflow step. The moisture absorbance is a value calculated from a weight change before and after the film for semiconductor back surface 2 is allowed to stand under an atmosphere of a temperature of 85° C. and a humidity of 85% RH for 168 hours. In the case where the film for semiconductor back surface 2 is formed of a resin composition containing a thermosetting resin, the moisture absorbance means a value obtained when the film after thermal curing is allowed to stand under an atmosphere of a temperature of 85° C. and a humidity of 85% RH for 168 hours. Moreover, the moisture absorbance can be regulated, for example, by changing the amount of the inorganic filler to be added.

Moreover, as the film for semiconductor back surface 2, one having a smaller ratio of volatile matter is more preferred. Specifically, the ratio of weight decrease (weight decrease ratio) of the film for semiconductor back surface 2 after heating treatment is preferably 1% by weight or less and more preferably 0.8% by weight or less. The conditions for the heating treatment are a heating temperature of 250° C. and a heating time of 1 hour. By regulating the weight decrease ratio to 1% by weight or less, the laser marking property can be enhanced. Moreover, for example, the generation of cracks in a flip chip type semiconductor device can be suppressed or prevented in the reflow step. The weight decrease ratio can be regulated, for example, by adding an inorganic substance capable of reducing the crack generation at lead-free solder reflow. In the case where the film for semiconductor back surface 2 is formed of a resin composition containing a thermosetting resin component, the weight decrease ratio is a value obtained when the film for semiconductor back surface after thermal curing is heated under conditions of a temperature of 250° C. and a heating time of 1 hour.

(Thermally Releasable Pressure-Sensitive Adhesive Sheet)

As illustrated in FIG. 1, the thermally releasable pressure-sensitive adhesive sheet 3 of the integrated film for semiconductor back surface, that is, a thermally releasable sheet includes a base material 31 and a pressure-sensitive adhesive layer 32 formed thereon. The pressure-sensitive adhesive layer 32 of the present embodiment includes a heat expandable layer 32a containing heat expandable microspheres that expand by heating and a non-heat expandable adherent layer 32b formed on the heat expandable layer 32a.

(Heat Expandable Layer)

The heat expandable layer 32a contains heat expandable microspheres that expand by heating. When it becomes uneven as a result of the expansion of the heat expandable microspheres, the adherent layer also becomes uneven and thereby reduces the adhesive force to the film for semiconductor back surface 2. Heat treatment of the heat expandable layer of the thermally releasable sheet which has been attached to the film for semiconductor back surface at desired time enables easy separation of the sheet from the film for semiconductor back surface.

The heat expandable layer 32a can be formed, for example, as a mixed layer of heat expandable microspheres and a binder. As the binder, any appropriate binder such as polymer or wax can be used insofar as it permits foaming and/or expansion of heat expandable microspheres through heating. Particularly, binders not limiting foaming and/or expansion of the heat expandable microspheres as much as possible are preferred. A pressure-sensitive adhesive is particularly preferred as the binder in consideration of its controllability of thermal expansion of the heat expandable microspheres or its controllability of pressure sensitive adhesion such as adhesive force via an adherent layer to the film for semiconductor back surface.

(Pressure-Sensitive Adhesive Layer)

The pressure-sensitive adhesive layer 32 is composed of a pressure sensitive adhesive and has tackiness. No particular limitation is imposed on the pressure-sensitive adhesive and can be selected as needed from known pressure-sensitive adhesives. From the viewpoint of the balance between the controllability of adequate adhesive force, before heating, to the film for semiconductor back surface via the pressures-sensitive adhesive layer and reduction in adhesive force due to heating, pressure-sensitive adhesives using, as a base polymer thereof, a polymer having a dynamic modulus of elasticity of from 50,000 to 10,000,000 dyn/cm$^2$ in a temperature range of from normal temperature to 150° C. are preferred, but not limited to them.

Concretely, as the pressure-sensitive adhesive, for example, those having the above-mentioned characteristics are suitably selected from known pressure-sensitive adhesives such as acrylic pressure-sensitive adhesives, rubber-based pressure-sensitive adhesives, vinyl alkyl ether-based pressure-sensitive adhesives, silicone-based pressure-sensitive adhesives, polyester-based pressure-sensitive adhesives, polyamide-based pressure-sensitive adhesives, urethane-based pressure-sensitive adhesives, fluorine-based pressure-sensitive adhesives, styrene-diene block copolymer-based pressure-sensitive adhesives, and creep characteristics-improved pressure-sensitive adhesives prepared by incorporating a thermofusible resin having a melting point of not higher than 200° C. to the above-mentioned pressure-sensitive adhesive (for example, see JP-A 56-61468, JP-A-61-174857, JP-A-63-17981, JP-A-56-13040, herein incorporated by reference), and are used herein. As the pressure-sensitive adhesive, also usable here are radiation-curable pressure-sensitive adhesives (or energy ray-curable pressure-sensitive adhesives). One or more such pressure-sensitive adhesives may be used here either singly or as combined. In this regard, examples of the radiation ray includes, X ray, ultraviolet ray and electron ray.

As the pressure-sensitive adhesive, preferred for use herein are acrylic pressure-sensitive adhesives and rubber-based pressure-sensitive adhesives, and more preferred are acrylic pressure-sensitive adhesives. The acrylic pressure-sensitive adhesives include those comprising, as the base polymer, an acrylic polymer (homopolymer or copolymer) of one or more alkyl (meth)acrylates as monomer component(s).

The alkyl (meth)acrylate for the acrylic pressure-sensitive adhesive includes, for example, methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, hexyl (meth)acrylate, heptyl (meth)acrylate, octyl (meth)acrylate, 2-ethylhexyl (meth)acrylate, isooctyl (meth)acrylate, nonyl (meth)acrylate, isononyl (meth)acrylate, decyl (meth)acrylate, isodecyl (meth)acrylate, undecyl (meth)acrylate, dodecyl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, eicosyl (meth)acrylate, etc. As the alkyl (meth)acrylate, preferred are those in which the alkyl group has from 4 to 18 carbon atoms. In the alkyl (meth)acrylate, the alkyl group may be linear or branched.

The acrylic polymer may contain, if desired, a unit corresponding to any other monomer component copolymerizable with the above-mentioned alkyl (meth)acrylate (copolymerizable monomer component), for the purpose of improving the cohesive force, the heat resistance and the crosslinkability thereof.

The copolymerizable monomer component includes, for example, carboxyl group-containing monomers such as (meth)acrylic acid (acrylic acid, methacrylic acid), carboxyethyl acrylate, carboxypentyl acrylate, itaconic acid, maleic acid, fumaric acid, crotonic acid;

acid anhydride group-containing monomers such as maleic anhydride, itaconic anhydride;

hydroxyl group-containing monomers such as hydroxyethyl (meth)acrylate, hydroxypropyl (meth)acrylate, hydroxybutyl (meth)acrylate, hydroxyhexyl (meth)acrylate, hydroxyoctyl (meth)acrylate, hydroxydecyl (meth)acrylate, hydroxylauryl (meth)acrylate, (4-hydroxymethylcyclohexyl) methyl methacrylate;

sulfonic acid group-containing monomers such as styrenesulfonic acid, allylsulfonic acid, 2-(meth)acrylamide-2-methylpropanesulfonic acid, (meth)acrylamide-propanesulfonic acid, sulfopropyl (meth)acrylate, (meth) acryloyloxynaphthalenesulfonic acid;

phosphoric acid group-containing monomers such as 2-hydroxyethyl acryloylphosphate;

(N-substituted) amide monomers such as (meth)acrylamide, N,N-dimethyl(meth)acrylamide, N-butyl(meth)acrylamide, N-methylol(meth)acrylamide, N-methylolpropane (meth)acrylamide;

aminoalkyl (meth)acrylate monomers such as aminoethyl (meth)acrylate, N,N-dimethylaminoethyl (meth)acrylate, t-butylaminoethyl (meth)acrylate;

alkoxyalkyl (meth)acrylate monomers such as methoxyethyl (meth)acrylate, ethoxyethyl (meth)acrylate;

cyanoacrylate monomers such as acrylonitrile, methacrylonitrile;

epoxy group-containing acrylic monomers such as glycidyl (meth)acrylate;

styrene monomers such as styrene, α-methylstyrene;

vinyl ester monomers such as vinyl acetate, vinyl propionate;

olefin monomers such as isoprene, butadiene, isobutylene;

vinyl ether monomers such as vinyl ether;

nitrogen-containing monomers such as N-vinylpyrrolidone, methylvinylpyrrolidone, vinylpyridine, vinylpiperidone, vinylpyrimidine, vinylpiperazine, vinylpyrazine, vinylpyrrole, vinylimidazole, vinyloxazole, vinylmorpholine, N-vinylcarbonamides, N-vinylcaprolactam;

maleimide monomers such as N-cyclohexylmaleimide, N-isopropylmaleimide, N-laurylmaleimide, N-phenylmaleimide;

itaconimide monomers such as N-methylitaconimide, N-ethylitaconimide, N-butylitaconimide, N-octylitaconimide, N-2-ethylhexylitaconimide, N-cyclohexylitaconimide, N-laurylitaconimide;

succinimide monomers such as N-(meth)acryloyloxymethylenesuccinimide, N-(meth)acryloyl-6-oxyhexamethylenesuccinimide, N-(meth)acryloyl-8-oxyoctamethylenesuccinimide;

acryl glycolate monomers such as polyethylene glycol (meth)acrylate, polypropylene glycol (meth)acrylate, methoxyethylene glycol (meth)acrylate, methoxypolypropylene glycol (meth)acrylate;

acrylate monomers having a hetero ring, a halogen atom, a silicone atom or the like such as tetrahydrofurfuryl (meth) acrylate, fluoro(meth)acrylate, silicone (meth)acrylate;

polyfunctional monomers such as hexanediol di(meth) acrylate, (poly)ethylene glycol di(meth)acrylate, (poly)propylene glycol di(meth)acrylate, neopentylglycol di(meth) acrylate, pentaerythritol di(meth)acrylate, trimethylolpropane tri(meth)acrylate, pentaerythritol tri (meth)acrylate, dipentaerythritol hexa(meth)acrylate, epoxyacrylate, polyester acrylate, urethane acrylate, divinylbenzene, butyl di(meth)acrylate, hexyl di(meth)acrylate, etc.

One or more these copolymerizable monomer components may be used here either singly or as combined.

The using amount of these copolymerizable monomers is preferably 40 wt % or less of all the monomer components used. In the case of the carboxyl-containing monomer, due to the reaction between the carboxyl group thereof and an epoxy group of the epoxy resin in the film for semiconductor back surface 2, a boundary surface between the pressure-sensitive adhesive layer 32 and the film for semiconductor back surface 2 disappears, which may lead to deterioration in releasability between them. The using amount of the carboxyl-containing monomer is therefore preferably from 0% but not greater than 3 wt % of all the monomer components. In addition, a hydroxyl-containing monomer or a glycidyl-containing monomer also reacts with the epoxy group of the epoxy resin so that the amount of it is also controlled as in the case of the carboxyl-containing monomer. Of these monomer components, the pressure-sensitive monomer 32 of the invention is preferably free of acrylic acid. Acrylic acid may undergo mass diffusion in the film for semiconductor back surface 2 to eliminate the boundary surface between the pressure-sensitive adhesive layer 32 and the film for semiconductor back surface 2 and thereby cause deterioration in the releasability.

The acrylic polymer is preferably free of a polyfunctional monomer as the monomer component for copolymerization. When the polyfunctional monomer is not contained, mass diffusion of the polyfunctional monomer in the film for semiconductor back surface does not occur and as a result, deterioration in the picking-up property which will otherwise occur due to the disappearance of a boundary surface between the pressure-sensitive adhesive layer 32 and the film for semiconductor back surface 2 can be prevented.

When the radiation-curable pressure-sensitive adhesive (or energy ray-curable pressure-sensitive adhesive) is used as the pressure-sensitive adhesive, examples of the radiation-curable pressure-sensitive adhesive (composition) include addition-type radiation-curable pressure-sensitive adhesives obtained by adding a radiation-curable monomer component or oligomer component to an acrylic pressure-sensitive adhesive. The acrylic pressure-sensitive adhesive uses an acrylic polymer as the base polymer thereof and it is preferred from the standpoint of cleaning and washing performance of a contamination-avoiding semiconductor wafer with ultrapure water or an organic solvent such as alcohol. Crosslinking and curing of this radiation-curable pressure-sensitive adhesive, together with reduction in peel force through heating, is utilized for further reduction in the adhesive force to the film for semiconductor back surface.

Examples of the radiation-curable monomer component to be added include urethane oligomers, urethane (meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa (meth)acrylate, and 1,4-butanediol di(meth)acrylate. Examples of the radiation curable oligomer component include various oligomers such as urethane, polyether, polyester, polycarbonate, and polybutadiene oligomers. The oligomers having a molecular weight in a range of from about 100 to 30,000 are preferred. The amount of the radiation-curable monomer or oligomer component can be determined as needed as an amount capable of reducing the tackiness of the pressure-sensitive adhesive layer, depending on the kind of the pressure-sensitive adhesive layer. It is generally, for example, from about 5 to 500 parts by weight, preferably from about 40 to 150 parts by weight based on 100 parts by weight of the base polymer such as an acrylic polymer which constitutes the pressure-sensitive adhesive.

The radiation-curable pressure-sensitive adhesives include, in addition to the addition-type radiation curable pressure-sensitive adhesives as described above, inclusion-type (internal-type) radiation-curable pressure-sensitive adhesives having, as the base polymer thereof, a polymer having a radical-reactive carbon-carbon double bond in the side chain thereof, in the main chain thereof, or at the end of the main chain thereof. This inclusion type radiation-curable pressure-sensitive adhesive is preferred because it does not need to contain a low molecular weight component such as oligomer component, or in many cases, does not contain a low molecular weight component so that it is free of the transfer of the oligomer component therein with the passage of time and therefore enables to form a pressure-sensitive adhesive layer having a stable layered structure.

As the base polymer having a radical-reactive carbon-carbon double bond, polymers having a radical-reactive carbon-carbon double bond and further having tackiness can be used without any particular limitation. This base polymer is preferably a polymer having, as the basic skeleton thereof, an acrylic polymer. Examples of the acrylic polymer as the basic skeleton include the acrylic polymers exemplified above.

No particular limitation is imposed on the method of introducing a radical-reactive carbon-carbon double bond into the acrylic polymer and various methods can be employed. Introduction of a radical-reactive carbon-carbon double bond into the side chain of the polymer is easy from the standpoint of molecular design. It is introduced, for example, by copolymerizing a hydroxyl-containing monomer with the acrylic polymer in advance and then carrying out condensation or addition reaction of the resulting copolymer and an isocyanate compound having a an isocyanate group reactive with the above-described hydroxyl group and a radical reactive carbon-carbon double bond while keeping the radiation curability of the radical reactive carbon-carbon double bond. Examples of the isocyanate compound having an isocyanate group and a radical reactive carbon-carbon bond include those exemplified above. Examples of the acrylic polymer include copolymers obtained by copolymerizing the hydroxyl-containing monomer exemplified above or an ether-based compound such as 2-hydroxyethyl vinyl ether, 4-hydroxybutyl vinyl ether or diethylene glycol monovinyl ether.

As the inclusion type radiation-curable pressure-sensitive adhesive, the above-described base polymer having a radical reactive carbon-carbon double bond (in particular, the acrylic polymer) may be used singly. The radiation-curable monomer component or oligomer component described above may be incorporated in the base polymer without deteriorating the properties of the base polymer. The amount of the radiation-curable oligomer component or the like is usually from about 5 to 500 parts by weight, preferably from about 40 to 150 parts by weight based on 100 parts by weight of the base polymer.

The radiation-curable pressure-sensitive adhesive contains a photopolymerization initiator when it is exposed to ultraviolet rays or the like for curing. Examples of the photopolymerization initiator include α-ketol-based compounds such as 4-(2-hydroxyethoxy)phenyl(2-hydroxy-2-propyl) ketone, α-hydroxy-α,α'-dimethylacetophenone, 2-methyl-2-hydroxypropiophenone, and 1-hydroxycyclohexyl phenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether-based compounds such as benzoin ethyl ether, benzoin isopropyl ether, and anisoin methyl ether; ketal-based compounds such as benzyl dimethyl ketal; aromatic sulfonyl chloride-based compounds such as 2-naphthalenesulfonyl chloride; optically active oxime-based compounds such as 1-phenone-1,1-propanedione-2-(o-ethoxycarbonyl)oxime; benzophenone-based compounds such as benzophenone, benzoylbenzoic acid, and 3,3'-dimethyl-4-methoxybenzophenone; thioxanthone-based compounds such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphor quinone; halogenated ketones; acylphosphinoxide; and acylphosphonate. The amount of the photopolymerization initiator is, for example, from about 0.05 to 20 parts by weight based on 100 parts by weight of the base polymer made of the acrylic polymer which constitutes the pressure-sensitive adhesive, or the like.

Further examples of the radiation-curable pressure-sensitive adhesive include those disclosed in JP-A-60-196956 which is herein incorporated by reference, such as rubber-based pressure-sensitive adhesives and acrylic pressure-sensitive adhesives each containing an addition-polymerizable compound having two or more unsaturated bonds, a photopolymerizable compound such as epoxy-containing alkoxysilane, and a photopolymerization initiator such as carbonyl compound, organic sulfur compound, peroxide, amine, or onium salt compound.

When curing inhibition with oxygen occurs upon exposure to radiation, the surface of the radiation curable pressure-sensitive adhesive layer 32 is preferably blocked from oxygen (air). Examples of the blocking method include a method of covering, with a separator, a portion of the pressure-sensitive adhesive layer 32 other than the portion 33 corresponding to a portion to which the film for semiconductor back surface 2 is attached and a method of exposing the layer to radiation such as ultraviolet rays in a nitrogen gas atmosphere.

In the invention, the pressure-sensitive adhesive layer 32 may contain various additives (e.g., a tackifying resin, a coloring agent, a thickener, an extender, a filler, a plasticizer, an antiaging agent, an antioxidant, a surfactant, a crosslinking agent, etc.) within the range where the advantages of the invention are not impaired.

The crosslinking agent is not particularly restricted and known crosslinking agents can be used. Specifically, as the crosslinking agent, not only isocyanate-based crosslinking agents, epoxy-based crosslinking agents, melamine-based crosslinking agents, and peroxide-based crosslinking agents but also urea-based crosslinking agents, metal alkoxide-based crosslinking agents, metal chelate-based crosslinking agents, metal salt-based crosslinking agents, carbodiimide-based crosslinking agents, oxazoline-based crosslinking agents, aziridine-based crosslinking agents, amine-based crosslinking agents, and the like may be mentioned, and isocyanate-based crosslinking agents and epoxy-based crosslinking agents are suitable. The crosslinking agent may be employed singly or in a combination of two or more kinds. Incidentally, the amount of the crosslinking agent to be used is not particularly restricted.

Examples of the isocyanate-based crosslinking agents include lower aliphatic polyisocyanates such as 1,2-ethylene diisocyanate, 1,4-butylene diisocyanate, and 1,6-hexamethylene diisocyanate; alicyclic polyisocyanates such as cyclopentylene diisocyanate, cyclohexylene diisocyanate, isophorone diisocyanate, hydrogenated tolylene diisocyanate, and hydrogenated xylylene diisocyanate; and aromatic polyisocyanates such as 2,4-tolylene diisocyanate, 2,6-tolylene diisocyanate, 4,4'-diphenylmethane diisocyanate, and xylylene diisocyanate. In addition, a trimethylolpropane/tolylene diisocyanate trimer adduct [a trade name "COLONATE L" manufactured by Nippon Polyurethane Industry Co., Ltd.], a trimethylolpropane/hexamethylene diisocyanate trimer adduct [a trade name "COLONATE HL" manufactured by Nippon Polyurethane Industry Co., Ltd.], and the like are also used. Moreover, examples of the epoxy-based crosslinking agents include N,N,N',N'-tetraglycidyl-m-xylenediamine, diglycidylaniline, 1,3-bis(N,N-glycidylaminomethyl)cyclohexane, 1,6-hexanediol diglycidyl ether, neopentyl glycol diglycidyl ether, ethylene glycol diglycidyl ether, propylene glycol diglycidyl ether, polyethylene glycol diglycidyl ether, polypropylene glycol diglycidyl ether, sorbitol polyglycidyl ether, glycerol polyglycidyl ether, pentaerythritol polyglycidyl ether, polyglycerol polyglycidyl ether, sorbitan polyglycidyl ether, trimethylolpropnane polyglycidyl ether, adipic acid diglycidyl ester, o-phthalic acid diglycidyl ester, triglycidyl-tris(2-hydroxyethyl)isocyanurate, resorcin diglycidyl ether, and bisphenol-S-diglycidyl ether, and also epoxy-based resins having two or more epoxy groups in the molecule.

The acrylic polymer may contain an isocyanate compound having a radical reactive carbon-carbon double bond in order to accelerate crosslinking by exposure to radiation and thereby improve the picking-up property. Examples of the isocyanate compound include methacryloyl isocyanate, 2-methacryloyloxyethyl isocyanate, 2-acryloyloxyethyl isocyanate, m-isopropenyl-α,α-dimethylbenzyl isocyanate.

When a crosslinking agent is used, the amount of it is determined as needed, depending on the balance with a base polymer to be crosslinked and further, depending on the intended use as a pressure-sensitive adhesive. The amount is usually about 20 parts by weight or less, more preferably from 0.1 to 10 parts by weight based on 100 parts by weight of the base polymer.

In place of using the crosslinking agent or along with the crosslinking agent in the invention, the pressure-sensitive adhesive layer may be crosslinked through irradiation with electron rays or UV rays.

The pressure-sensitive adhesive layer 32 can be, for example, formed by utilizing a commonly used method including mixing a pressure-sensitive adhesive and optional solvent and other additives and then shaping the mixture into a sheet-like layer. Specifically, for example, there may be mentioned a method including applying a mixture containing a pressure-sensitive adhesive and optional solvent and other additives on the base material 31; a method including applying the foregoing mixture on an appropriate separator (such as a release paper) to form a pressure-sensitive adhesive layer 32 and then transferring (transcribing) it on the base material 31; or the like.

(Heat Expandable Microspheres)

Heat expandable microspheres to be incorporated in the heat expandable layer are, for example, microcapsules obtained by encapsulating, in the shell thereof made of a shell forming substance, a substance easily gasified and exhibiting thermal expansion. Examples of the substance exhibiting thermal expansion include easily gasified substances such as isobutane, propane, and pentane. Examples of the shell forming substance include heat melting substances and substances broken by thermal expansion such as vinylidene chloride-acrylonitrile copolymer, polyvinyl alcohol, polyvinyl butyral, polymethyl methacrylate, polyacrylonitrile, polyvinylidene chloride, and polysulfone. The heat expandable substance is encapsulated in the shell, for example, by a coacervation method or an interfacial polymerization method.

Using the heat expandable microspheres can stably suppress an increase in the degree of contamination of the film for semiconductor back surface caused heating. A foaming agent or the like not in the form of microcapsules is not so effective for suppressing an increase in the degree of contamination presumably because it causes cohesive failure of the pressure-sensitive adhesive layer. In consideration of ease of reduction in the adhesiveness by heating, particularly, stable achievement of the reduction in the adhesiveness, preferred are heat expandable microspheres that continue to show a volume expansion of at least 5 times, more preferably at least 7 times, particularly preferably at least 10 times until the rupture or completion of expansion.

The average particle size of the heat expandable microspheres can be determined as needed. It is usually 100 μm or less, more preferably 80 μm or less, particularly preferably from 1 to 50 μm. But the particle size is not limited to them. Incidentally, commercially available products such as "MATSUMOTO MICROSPHERE" (trade name; product of Matsumoto Yushi-Seiyaku) may be used as the heat expandable microspheres.

The amount of the heat expandable microspheres may be determined as needed, depending on the volume expansion rate or reduction degree of adhesiveness of the heat expandable layer. When the heat expandable layer is composed of the binder or adhesive as described above, the heat expandable microspheres are used in an amount of usually from 1 to 150 parts by weight, preferably from 10 to 130 parts by weight, particularly preferably from 25 to 100 parts by weight based on 100 parts by weight of the base polymer.

The heat expandable layer can be formed, for example, by mixing components such as the heat expandable microspheres and the binder by using, if necessary, a solvent and then spreading the resulting mixture into a sheet-like layer by an appropriate method such as method of application.

The thickness of the heat expandable layer can be determined as needed based on the reduction degree of adhesiveness. When the thickness is too small, the surface of the layer becomes uneven due to the shape of the heat expandable microspheres and the adherent layer provided thereon also has an uneven surface, preventing exhibition of sufficient adhesiveness or causing cohesion failure of the adherent layer lying on the heat expandable layer upon heat treatment to increase the degree of contamination of the film for semiconductor back surface. When the thickness is too great, on the other hand, the adhesiveness does not decrease sufficiently due to insufficient heat deformation. From the standpoint of preventing such phenomena, the thickness is preferably 300 μm or less, more preferably from 2 to 200 μm, particularly preferably from 5 to 150 μm.

(Base Material)

When the heat expandable layer 32a is formed, the heat expandable layer 32a is supported by the base material 31 as illustrated in the drawings. Such a support form is advantageous because the heat expandable layer and moreover, the adherent layer are supported and reinforced by the base material to improve the handling ease of the thermally releasable pressure-sensitive adhesive sheet and attachment to the film for semiconductor back surface and release therefrom after heating can be conducted efficiently.

The base material 31 preferably has a radiation ray-transmitting property. As the base material 31, for example, suitable thin materials, e.g., paper-based base materials such as paper; fiber-based base materials such as fabrics, non-woven fabrics, felts, and nets; metal-based base materials such as metal foils and metal plates; plastic base materials such as plastic films and sheets; rubber-based base materials such as rubber sheets; foamed bodies such as foamed sheets; and laminates thereof [particularly, laminates of plastic based materials with other base materials, laminates of plastic films (or sheets) each other, etc.] can be used. In the invention, as the base material, plastic base materials such as plastic films and sheets can be suitably employed. Examples of raw materials for such plastic materials include olefinic resins such as polyethylene (PE), polypropylene (PP), and ethylene-propylene copolymers; copolymers using ethylene as a monomer component, such as ethylene-vinyl acetate copolymers (EVA), ionomer resins, ethylene-(meth)acrylic acid copolymers, and ethylene-(meth)acrylic acid ester (random, alternating) copolymers; polyesters such as polyethylene terephthalate (PET), polyethylene naphthalate (PEN), and polybutylene terephthalate (PBT); acrylic resins; polyvinyl chloride (PVC); polyurethanes; polycarbonates; polyphenylene sulfide (PPS); amide-based resins such as polyamides (Nylon) and whole aromatic polyamides (aramide); polyether ether ketones (PEEK); polyimides; polyetherimides; polyvinylidene chloride; ABS (acrylonitrile-butadiene-styrene copolymers); cellulose-based resins; silicone resins; and fluorinated resins. Among them, those having excellent heat resistance that does not melt at the heat treatment temperature of the heat expandable layer are preferable in terms of handling property after heating.

In addition, the materials for the base material 31 include polymers such as crosslinked materials of the foregoing resins. The plastic films may be used without stretching or may be used after subjected to a uniaxial or biaxial stretching treatment, if necessary. According to the resin sheet to which thermal contraction property is imparted by a stretching treatment or the like, the adhered area between the pressure-sensitive adhesive layer 32 and the film for semiconductor back surface 2 is reduced by thermal contraction of the base material 31 after dicing and thus the recovery of the semiconductor chip can be facilitated. In the case of treating the adherent layer with radiation ray or the like, a substrate that transmits such ray may be employed.

As the base material 31, the same kind or different kinds of materials can be suitably selected and used and, if necessary, several kinds of materials can be blended and used. Moreover, to the base material 31, for imparting antistatic ability, a vapor deposition layer of a conductive substance having a thickness of about 30 to 500 angstrom, which is composed of a metal, alloy or an oxide thereof, can be formed on the base material 31. The base material 31 may be a single layer or a multilayer of two or more thereof.

The thickness (total thickness in the case of the laminated layer) of the base material 31 is not particularly restricted and can be appropriately selected depending on strength, flexibility, intended purpose of use, and the like. For example, the thickness is generally 1,000 μm or less (e.g., 1 μm to 1,000 μm), preferably 10 μm to 500 μm, further preferably 20 μm to 300 μm, and particularly preferably about 30 μm to 200 μm but is not limited thereto.

Incidentally, the base material 31 may contain various additives (a coloring agent, a filler, a plasticizer, an antiaging agent, an antioxidant, a surfactant, a flame retardant, etc.) within the range where the advantages and the like of the invention are not impaired.

The sheet which is one of the forms of the supporting base material can be formed by an appropriate method, for example, by carrying out the spreading operation described above on the base material to directly install a heat expandable layer on the base material or by providing a heat expandable layer on a separator similarly and transferring and attaching the heat expandable layer to the base material.

The separator can be obtained as the base material surface treated with an appropriate release agent such as silicone-based, long-chain alkyl-based, or fluorine-containing agent or molybdenum sulfide; low-adhesion base material composed of a fluorine-containing polymer such as polytetrafluoroethylene, polychlorotrifluoroethylene, vinyl polyfluoride, vinylidene polyfluoride, tetrafluoroethylene hexafluoropropylene copolymer, or chlorotrifluoroethylene vinylidene fluoride, or a low-adhesion base material composed of a nonpolar polymer such as polyethylene, polypropylene, or α-olefin. The separator may also be used as the base material for supporting the heat expandable layer.

The base material excellent in adhesive force with the heat expandable material can be obtained, for example, by a method using a film composed of a high polarity polymer such as polyester or a method of subjecting a base material to a proper treatment such as chemical or physical surface oxidizing treatment using chromic acid treatment, ozone exposure, flame exposure, high-pressure shock exposure, or ionized radiation treatment.

A method of providing the base material with an undercoat layer is also effective for improving the adhesive force between the base material and the heat expandable layer. One or more intermediate layers may be provided between the base material and the heat expandable layer. The intermediate layer may have an appropriate purpose similar to the undercoat layer provided for improving the adhesive force.

Examples of the intermediate layer other than the undercoat layer include a layer for imparting good deformability, a layer for improving adhesive force, a layer for facilitating the heat treatment for reducing the adhesive force, and a layer for improving the releasability from the film for semiconductor back surface after heating.

From the standpoint of imparting deformability or improving the releasability after heating, a rubbery organic elastic layer 34 composed mainly of a synthetic rubber or a synthetic resin is preferably provided as the intermediate layer as illustrated in FIG. 2. Such a rubbery organic elastic layer has various functions such as a function of heightening controllability of expansion of the heat expandable layer upon heating and a function of expanding the heat expandable layer by heating in a thickness direction rather than in a plane direction to form an expanded layer excellent in uniform thickness and thereby facilitate release of the film for semiconductor back surface 2 from the thermally releasable sheet 3.

The thickness of the rubbery organic elastic layer is usually 500 μm or less, more preferably from 3 to 300 μm, particularly preferably from 5 to 150 μm from the standpoint of various functions described above, but it is not limited to them.

Examples of the synthetic rubber or synthetic resin include synthetic rubbers such as nitrile rubber, diene rubber, and acrylic rubber, thermoplastic elastomers such as polyolefin elastomer and polyester elastomer, and synthetic resins having rubber elasticity such as ethylene-vinyl acetate copolymer, polyurethane, polybutadiene, and soft polyvinyl chloride. Polymers which are essentially hard ones such as polyvinyl chloride but are imparted with rubber elasticity by using in combination with a compounding agent such as plasticizer or softener can also be used in the invention.

The rubbery organic elastic layer may be made of a tacky substance composed mainly of the above-described forming material or made of a foamed film composed mainly of such a component. The rubbery organic elastic layer can be formed as needed, for example, by applying a solution of the forming material onto a base material or attaching a film composed of the forming material to the base material. It is preferred to laminate the rubbery organic elastic layer on a side of the heat expandable layer opposite to the adherent layer from the viewpoint of the above-described effect and the like. Incidentally, when the adherent layer is treated with radiation or the like, the intermediate layer is required to transmit the radiation or the like.

(Adherent Layer)

In the present embodiment, the adherent layer is provided on the heat expandable layer in order to prevent an increase of a contaminant, particularly a micro contaminant on the film for semiconductor back surface upon attachment of the thermally releasable sheet to the film for semiconductor back surface and reduction treatment of an adhesive force by heating.

With regards to the contamination level, after the thermally releasable pressure-sensitive adhesive sheet attached to a semiconductor silicon wafer is cured by exposure to radiation and is then released by heating, the surface organic contaminant amount AC of the semiconductor silicon wafer is 50 or less, preferably 30 or less, more preferably 10 or less, still more preferably 5 or less. The surface organic contaminant amount C/Si is preferably 2.5 or less, more preferably 1.0 or less, still more preferably 0.5 or less. The surface organic contaminant amount AC and surface organic contaminant amount C/Si can be measured using X-ray electron spectroscopy for chemical analysis (ESCA).

The adherent layer can be prepared using an appropriate pressure-sensitive adhesive, depending on the desired adhesion properties such as adhesive force to the film for semiconductor back surface. No particular limitation is imposed on the kind of it. Any of the pressure-sensitive adhesives exemplified in the section of the heat expandable layer and known products can be used. Those limiting the thermal deformation of the heat expandable layer as less as possible are preferred.

Among them, preferred are pressure-sensitive adhesives containing an appropriate crosslinking agent composed of, for example, a polyfunctional isocyanate-based crosslinking agent such as tolylene diisocyanate, trimethylolpropane tolylene diisocyanate, or diphenylmethane triisocyanate, an epoxy-based crosslinking agent such as polyethylene glycol diglycidyl ether, diglycidyl ether, or trimethylolpropane triglycidyl ether, a melamine-based resin crosslinking agent such as alkyl-etherified melamine compound, a metal salt-based crosslinking agent; a metal chelate-based crosslinking agent, an amino-based crosslinking agent, a peroxide-based crosslinking agent, or a silane coupling agent.

Such a pressure-sensitive adhesive preferably contains low-molecular-weight molecules in a smaller proportion from the standpoint of lower contamination to the film for semiconductor back surface. In the pressure-sensitive adhesive, the proportion of molecules having a molecular weight of 100,000 or less is preferably 15% or less, more preferably 10% or less, still more preferably 5% or less. In the non-heat expandable adherent layer after radiation curing of the radiation curable pressure-sensitive adhesive, the proportion of molecules having a molecular weight of 100,000 or less is 15% or less, preferably 10% or less, more preferably 5% or less. The molecular weight of the pressure-sensitive adhesive and the proportion of low-molecular-weight molecules are determined from a value obtained using gel permeation chromatography with polystyrene standard.

As a method of reducing the proportion of low-molecular-weight molecules in the pressure-sensitive adhesive, the following methods are usable, but the method is not particularly limited to them.

(1) An acrylic polymer or the like obtained by polymerization or the like is added to a non-solvent or poor solvent such as heptane (an aliphatic hydrocarbon), followed by stirring. A low-molecular substance in the polymer then dissolves in heptane, while a high molecular substance in the polymer precipitates. Such an operation is repeated to obtain an acrylic polymer containing low-molecular-weight molecules in a small proportion.

(2) Ordinary radical polymerization inevitably prepares a polymer containing low-molecular-weight molecules in a high proportion because of a large molecular weight distribution. Living radical polymerization or anionic polymerization however enables to prepare a polymer having a small molecular weight distribution so that a polymer containing low-molecular-weight molecules in a small proportion can be obtained.

(3) In the ordinary radical polymerization, a polymer having a large molecular weight is prepared in the initial stage, but in the final stage, a polymer having a small molecular weight is prepared. A pressure-sensitive adhesive containing low-molecular-weight molecules in a small proportion can therefore be obtained by using a polymer having a polymerization rate of from 80.5% to 97% as the polymer of the pressure-sensitive adhesive.

The remaining monomer may be removed using the above-described heptane or the like or may be evaporated by applying high heat upon drying.

When the thermally releasable sheet is not equipped with the adherent layer, the molecular weight of the pressure-sensitive adhesive constituting the heat expandable layer is set preferably within the above-described range from the standpoint of preventing contamination of the film for semiconductor back surface due to the heat expandable layer.

The pressure-sensitive adhesive used for the formation of the adherent layer may contain an appropriate additive such as plasticizer, filler, surfactant, antioxidant, or tackifier as described above. When transfer of such an additive to the film for semiconductor back surface poses a problem as in the case where low contamination as described above is desired, however, the pressure-sensitive adhesive may be an additive-free composition.

The adherent layer can be formed by using an appropriate method, for example, by applying the pressure-sensitive adhesive in liquid form onto the heat expandable layer or transferring and attaching an adherent layer formed similarly onto a separator to the heat expandable layer. The thickness of the adherent layer may be determined as needed, depending on the intended use of the pressure-sensitive adhesive sheet or the degree of reduction in the adhesive force by heating.

In general, when the adherent layer is too thin, shortage of adhesive force or cohesion failure upon heating tends to occur to make the heat expandable layer uneven. When it is too thick, on the other hand, it does not easily follow the unevenness of the heat expandable layer formed by heating. The thickness of the adherent layer is preferably 20 μm or less, more preferably from 0.1 to 10 μm, particularly preferably from 1 to 5 μm in consideration of prevention of cohesion failure upon thermal deformation, prevention of an increase in the amount of a contaminant attached to the film for semiconductor back surface, followability to unevenness of the heat expandable layer, and reduction or loss of adhesive force to the film for semiconductor back surface.

Not specifically defined, the thickness of the pressure-sensitive adhesive layer 32 (in the case of providing adherent layer, the total of the thickness of the heat expandable layer and the thickness of the adherent layer) is, for example, from 5 µm to 300 µm (preferably from 5 µm to 200 µm, more preferably from 5 µm to 150 µm, even more preferably from 7 µm to 100 µm) or so. When the thickness of the pressure-sensitive adhesive layer 32 falls within the above range, then the layer may exhibit suitable pressure-sensitive adhesive force. The pressure-sensitive adhesive layer 32 may be either a single layer or a multilayer.

The adhesive force of the pressure-sensitive adhesive layer 32 (in the case of providing adherent layer, the adhesive force of the adherent layer 32b) of the thermally releasable layer 3 to the film for flip chip type semiconductor back surface 2 (23° C., peeling angle of 180 degrees, peeling rate of 300 mm/min) is preferably within a range of from 0.02 N/20 mm to 10 N/20 mm, more preferably from 0.05 N/20 mm to 5 N/20 mm. When the adhesive force is at least 0.02 N/20 mm, then the semiconductor chips may be prevented from flying away in dicing semiconductor wafer. On the other hand, when the adhesive force is at most 10 N/20 mm, then it facilitates peeling of semiconductor chips in picking up them, and prevents the pressure-sensitive adhesive from remaining.

Incidentally, in the invention, the thermally releasable sheet-integrated film for semiconductor back surface 1 can be made to have an antistatic function. Owing to this configuration, the circuit can be prevented from breaking down due to the generation of electrostatic energy at the time adhesion and at the time of peeling thereof or due to charging of a semiconductor wafer or the like by the electrostatic energy. Imparting of the antistatic function can be performed by an appropriate manner such as a method of adding an antistatic agent or a conductive substance to the base material 31, the pressure-sensitive adhesive layer 32, and the film for semiconductor back surface 2, or a method of providing a conductive layer composed of a charge-transfer complex, a metal film, or the like onto the base material 31. As these methods, a method in which an impurity ion having a fear of changing quality of the semiconductor wafer is difficult to generate is preferable. Examples of the conductive substance (conductive filler) to be blended for the purpose of imparting conductivity, improving thermal conductivity, and the like include a sphere-shaped, a needle-shaped, or a flake-shaped metal powder of silver, aluminum, gold, copper, nickel, a conductive alloy, or the like; a metal oxide such as alumina; amorphous carbon black, and graphite. However, the film for semiconductor back surface 2 is preferably non-conductive from the viewpoint of having no electric leakage.

Moreover, the thermally releasable sheet-integrated film for semiconductor back surface 1 may be formed in a form where it is wound as a roll or may be formed in a form where the sheet (film) is laminated. For example, in the case where the film has the form where it is wound as a roll, the film is wound as a roll in a state that the laminate of the film for semiconductor back surface 2 and the thermally releasable sheet 3 is protected by a separator according to needs, whereby the film can be prepared as or a thermally releasable sheet-integrated film for semiconductor back surface 1 in a state or form where it is wound as a roll. In this regard, the thermally releasable sheet-integrated film for semiconductor back surface 1 in the state or form where it is wound as a roll may be constituted by the base material 31, the pressure-sensitive adhesive layer 32 formed on one surface of the base material 31, the film for semiconductor back surface 2 formed on the pressure-sensitive adhesive layer 32, and a releasably treated layer (rear surface treated layer) formed on the other surface of the base material 31.

Incidentally, the thickness of the thermally releasable sheet-integrated film for semiconductor back surface 1 (total thickness of the thickness of the film for semiconductor back surface and the thickness of the thermally releasable sheet including the base material 31 and the pressure-sensitive adhesive layer 32) can be, for example, selected from the range of 8 µm to 1,500 µm, and it is preferably from 20 µm to 850 µm, more preferably 31 µm to 500 µm, and particularly preferably 47 µm to 330 µm.

In this regard, in the thermally releasable sheet-integrated film for semiconductor back surface 1, by controlling the ratio of the thickness of the film for semiconductor back surface 2 to the thickness of the pressure-sensitive adhesive layer 32 of the thermally releasable sheet 3 or the ratio of the thickness of the film for semiconductor back surface 2 to the thickness of the thermally releasable sheet (total thickness of the base material 31 and the pressure-sensitive adhesive layer 32), a dicing property at the dicing step, a picking-up property at the picking-up step, and the like can be improved and the thermally releasable sheet-integrated film for semiconductor back surface 1 can be effectively utilized from the dicing step of the semiconductor wafer to the flip chip bonding step of the semiconductor chip.

Using the thermally releasable sheet-integrated film for semiconductor back surface according to the invention enables to reduce the adhesive force by heating and suppress an increase in a contaminant, particularly, a micro contaminant, due to this reduction treatment and in addition, when the adherent layer is provided, enables to determine adhesion characteristics such as adhesive force as desired. It is therefore possible to carry out treatments required to have functions contradictory to each other, that is, a function of attaching the thermally releasable sheet to the film for semiconductor back surface with strong adhesive force during the procedures, for example, from a dicing step of a semiconductor wafer to a picking-up step of a semiconductor element, and a function of reducing the adhesive force upon release to accelerate releasability. At the same time, contamination of the film for semiconductor back surface can be reduced when it is released from the adhesion state.

The reduction of peel force of the thermally releasable sheet can be achieved not only by the above-described formation of the heat expandable layer containing heat expandable microspheres but, for example, reduction in peel force through heat curing of the pressure-sensitive adhesive layer may be utilized. Heat curing can be performed by incorporating a reactive functional group (such as epoxy or carboxyl) in the pressure-sensitive adhesive in advance, followed by crosslinking by heating.

(Thermal Release Method)

Heat treatment for reducing the adhesive force of the thermally releasable pressure-sensitive adhesive sheet can be performed through an appropriate heating means such as hot plate, hot air drier, or near infrared lamp. The heat treatment conditions can be determined, depending on various factors such as a decrease in the attached area due to the surface condition of the film for semiconductor back surface or kind of the heat expandable microspheres, heat resistance of the base material or adherend, heat capacity, heating means, or the like.

The heating conditions depend on the kind or area of the film for semiconductor back surface, but heating at a temperature higher by at least 50° C. than the expansion starting temperature of the heat expandable microspheres is preferred. Heating is usually performed at a temperature of from 100 to 250° C. for from 5 to 90 seconds (with a hot plate or the like) or from 1 to 15 minutes (with a hot air drier). Heating conditions are not limited to them. The heat treatment under the above-described conditions typically causes expansion and/or foaming of the heat expandable microspheres to make the surface of the heat expandable layer uneven and thereby make the surface of the adherent layer uneven, leading to deterioration or loss of the adhesive force with the film for semiconductor back surface.

Using such a thermally releasable sheet enables release of, for example, an eight-inch silicon wafer having a thickness of 30 μm within three seconds. The adherents may be released simultaneously or parts arranged on the pressure-sensitive adhesive layer may be thermally released one by one.

(Producing Method of Thermally Releasable Sheet-Integrated Film for Semiconductor Back Surface)

The producing method of the thermally releasable sheet-integrated film for semiconductor back surface according to the present embodiment is described while using the thermally releasable sheet-integrated film for semiconductor back surface 1 shown in FIG. 1 as an example. First, the base material 31 can be formed by a conventionally known film-forming method. Examples of the film-forming method include a calendar film-forming method, a casting method in an organic solvent, an inflation extrusion method in a closely sealed system, a T-die extrusion method, a co-extrusion method, and a dry laminating method.

Then, a pressure-sensitive adhesive composition is applied to the base material 31, followed by drying (thermal crosslinking, if necessary) to form a pressure-sensitive adhesive layer 32. When the pressure-sensitive adhesive layer includes a heat expandable layer and an adherent layer, the adherent layer can be formed by applying a pressure-sensitive adhesive composition containing heat expandable microspheres onto a base material and drying the same to obtain a heat expandable layer, then applying a pressure-sensitive adhesive composition not containing heat expandable microspheres onto the resulting heat expandable layer and drying the same. The application is conducted through roll coating, screen coating, gravure coating, or the like. The pressure-sensitive adhesive layer 32 may be formed on the base material 31 by applying the pressure-sensitive adhesive composition directly to the base material 31. Alternatively, after the pressure-sensitive adhesive composition may be applied to release paper or the like having a surface subjected to release treatment to form the pressure-sensitive adhesive layer 32, the pressure-sensitive adhesive layer 32 may be transferred to the base material 31. As a result, the thermally releasable sheet 3 having the pressure-sensitive adhesive layer 32 on the base material 31 is prepared.

On the other hand, a forming material for forming the film for semiconductor back surface 2 is applied onto a release sheet to form a coating layer having a predetermined thickness after dried, and then dried under a predetermined condition (optionally heated in case where thermal curing is necessary, and dried) to form the coating layer. The coating layer is transferred onto the pressure-sensitive adhesive layer 32 to thereby form the film for semiconductor back surface 2 on the pressure-sensitive adhesive layer 32. The film for semiconductor back surface 2 may also be formed on the pressure-sensitive adhesive layer 32 by directly applying the forming material for forming the film for semiconductor back surface 2 onto the pressure-sensitive adhesive layer 32 and then drying it under a predetermined condition (optionally heating it in case where thermal curing is necessary, and drying it). According to the process as above, the thermally releasable sheet-integrated film for semiconductor back surface 1 of the invention can be obtained. In case where thermal curing is needed in forming the film for semiconductor back surface 2, it is important that the thermal curing is effected to such a degree that the coating layer could be partially cured, but preferably, the coating layer is not thermally cured.

The thermally releasable sheet-integrated film for semiconductor back surface 1 of the invention can be suitably used at the production of a semiconductor device including the flip chip connection step. Namely, the thermally releasable sheet-integrated film for semiconductor back surface 1 of the invention is used at the production of a flip chip-mounted semiconductor device and thus the flip chip-mounted semiconductor device is produced in a condition or form where the film for semiconductor back surface 2 of the thermally releasable sheet-integrated film for semiconductor back surface 1 is attached to the back surface of the semiconductor chip. Therefore, the thermally releasable sheet-integrated film for semiconductor back surface 1 of the invention can be used for a flip chip-mounted semiconductor device (a semiconductor device in a state or form where the semiconductor chip is fixed to an adherend such as a substrate by a flip chip bonding method).

The film for semiconductor back surface 2 is usable also for flip chip-mounted semiconductor devices (semiconductor devices in a state or form where a semiconductor chip is fixed to the adherend such as a substrate or the like in a flip chip bonding method), like in the thermally releasable sheet-integrated film for semiconductor back surface 1.

(Semiconductor Wafer)

The semiconductor wafer is not particularly restricted as long as it is a known or commonly used semiconductor wafer and can be appropriately selected and used among semiconductor wafers made of various materials. In the invention, as the semiconductor wafer, a silicon wafer can be suitable used.

(Collection Method of Semiconductor Element and Production Method of Semiconductor Device)

The collection method of a semiconductor element and the production method of a semiconductor device according to the present embodiment will next be described referring to FIGS. 3A to 3D. FIGS. 3A to 3D are schematic cross-sectional views showing the production method of a semiconductor device when the thermally releasable sheet-integrated film for semiconductor back surface 1 is used.

The collection method of a semiconductor element according to the invention includes a step of attaching a semiconductor wafer onto the film for semiconductor back surface, which is a portion of the thermally releasable sheet-integrated film for semiconductor back surface, a step of dicing the semiconductor wafer into individual semiconductor elements, a step of heating the thermally releasable sheet-integrated film for semiconductor back surface, and a step of releasing the semiconductor elements together with the film for semiconductor back surface from a pressure-sensitive adhesive layer of the thermally releasable sheet. The production method of a semiconductor device according to the invention includes a step of flip chip connecting, onto an adherend, of the semiconductor elements collected by the collection method of a semiconductor element. This means that the collection method of a semiconductor element corresponds to a portion of a series of steps of the production method of a semiconductor device so that a description of the production method will next be made while including a description of the collection method.

(Mounting Step)

Figure 3A:
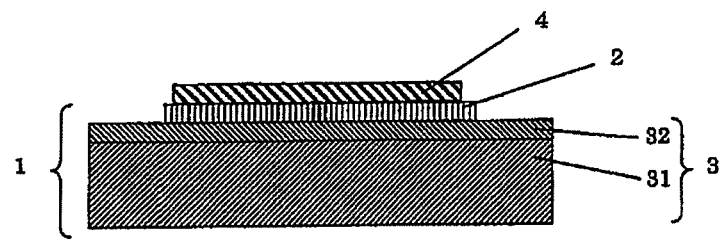
FIG. 3A to 3D are schematic cross-sectional views showing one example of the production method of a semiconductor device using the thermally releasable sheet-integrated film for semiconductor back surface according to the invention.

First, as shown in FIG. 3A, a separator optionally provided on the film for semiconductor back surface 2 of the thermally releasable sheet-integrated film for semiconductor back surface 1 is suitably peeled off and the semiconductor wafer 4 is attached onto the film for semiconductor back surface 2 to be fixed by adhesion and holding (mounting step). On this occasion, the film for semiconductor back surface 2 is in an uncured state (including a semi-cured state). Moreover, the thermally releasable sheet-integrated film for semiconductor back surface 1 is attached to the back surface of the semiconductor wafer 4. The back surface of the semiconductor wafer 4 means a face opposite to the circuit face (also referred to as non-circuit face, non-electrode-formed face, etc.). The attaching method is not particularly restricted but a method by press bonding is preferred. The press bonding is usually performed while pressing with a pressing means such as a pressing roll.

(Dicing Step)

Figure 3B:
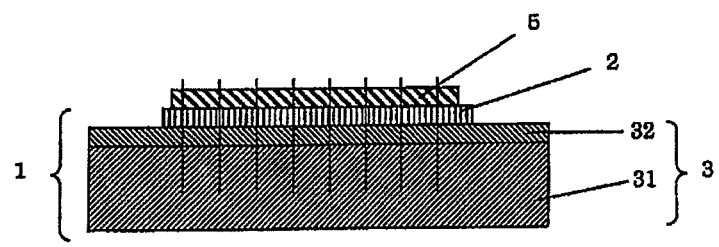

Next, as shown in FIG. 3B, the semiconductor wafer 4 is diced. Thereby, the semiconductor wafer 4 is cut into a prescribed size and individualized (is formed into small pieces) to produce semiconductor chips (semiconductor elements) 5. The dicing is performed according to a normal method from the circuit face side of the semiconductor wafer 4, for example. Moreover, the present step can adopt, for example, a cutting method called full-cut that forms a slit reaching the thermally releasable sheet-integrated film for semiconductor back surface 1. The dicing apparatus used in the present step is not particularly restricted, and a conventionally known apparatus can be used. Further, since the semiconductor wafer 4 is adhered and fixed by the thermally releasable sheet-integrated film for semiconductor back surface 1 having the film for semiconductor back surface, chip crack and chip fly can be suppressed, as well as the damage of the semiconductor wafer 4 can also be suppressed. In this regard, when the film for semiconductor back surface 2 is formed of a resin composition containing an epoxy resin, generation of adhesive extrusion from the adhesive layer of the film for semiconductor back surface can be suppressed or prevented at the cut surface even when it is cut by dicing. As a result, re-attachment (blocking) of the cut surfaces themselves can be suppressed or prevented and thus the picking-up to be mentioned below can be further conveniently performed.

In the case where the thermally releasable sheet-integrated film for semiconductor back surface 1 is expanded, the expansion can be performed using a conventionally known expanding apparatus. The expanding apparatus has a doughnut-shaped outer ring capable of pushing the thermally releasable sheet-integrated film for semiconductor back surface 1 downward through a dicing ring and an inner ring which has a diameter smaller than the outer ring and supports the thermally releasable sheet-integrated film for semiconductor back surface. Owing to the expanding step, it is possible to prevent the damage of adjacent semiconductor chips through contact with each other in the picking-up step to be mentioned below.

(Heating Step)

The thermally releasable sheet-integrated film for semiconductor back surface 1 is then heat-treated to reduce the peel force between the thermally releasable sheet and the film for semiconductor back surface. The heating method has already been described in the section of the thermally releasable sheet so that a description on it is omitted herein.

(Picking-Up Step)

Figure 3C:
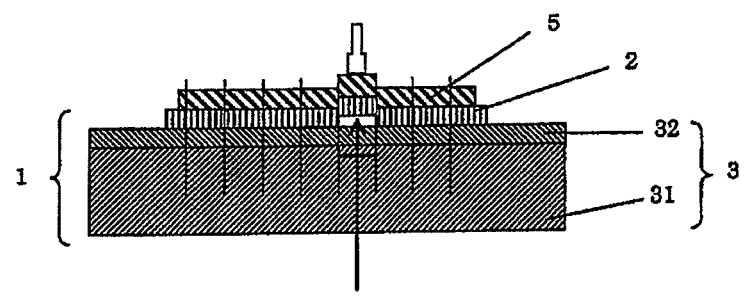

In order to collect the semiconductor chip 5 that is adhered and fixed to the thermally releasable sheet-integrated film for semiconductor back surface 1, picking-up of the semiconductor chip 5 is performed as shown in FIG. 3C to peel the semiconductor chip 5 together with the film for semiconductor back surface 2 from the thermally releasable sheet 3. In the production method of the semiconductor device, since the peeling force between the thermally releasable sheet and the film for semiconductor back surface is decreased in the heating step carried out prior to the pickup step, the semiconductor chip 5 can be corrected smoothly. The method of picking-up is not particularly restricted, and conventionally known various methods can be adopted. For example, there may be mentioned a method including pushing up each semiconductor chip 5 from the base material 31 side of the thermally releasable sheet-integrated film for semiconductor back surface 1 with a needle and picking-up the pushed semiconductor chip 5 with a picking-up apparatus. In this regard, the back surface of the picked-up semiconductor chip 5 is protected with the film for semiconductor back surface 2.

(Flip Chip Connection Step)

Figure 3D:
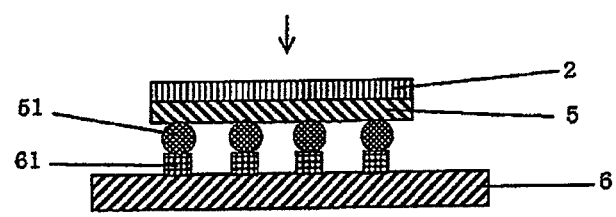

The picked-up semiconductor chip 5 is fixed to an adherend 6 such as a substrate by a flip chip bonding method (flip chip mounting method) as shown in FIG. 3D. Specifically, the semiconductor chip 5 is fixed to the adherend 6 according to a usual manner in a form where the circuit face (also referred to as a front face, circuit pattern-formed face, electrode-formed face, etc.) of the semiconductor chip 5 is opposed to the adherend 6. For example, the bump 51 formed at the circuit face side of the semiconductor chip 5 is brought into contact with a conductive material 61 (such as solder) for conjunction attached to a connecting pad of the adherend 6 and the conductive material 61 is melted under pressing, whereby electric connection between the semiconductor chip 5 and the adherend 6 can be secured and the semiconductor chip 5 can be fixed to the adherend 6 (flip chip bonding step). On this occasion, gaps are formed between the semiconductor chip 5 and the adherend 6 and the distance between the gaps is generally about 30 μm to 300 μm. In this regard, after the flip chip bonding (flip chip connecting) of the semiconductor chip 5 on the adherend 6, it is important that the opposing faces of the semiconductor chip 5 and the adherend 6 and the gaps are washed and an encapsulating material (such as an encapsulating resin) is then filled into the gaps to perform encapsulation.

As the adherend 6, various substrates such as lead frames and circuit boards (such as wiring circuit boards) can be used. The material of the substrates is not particularly restricted and there may be mentioned ceramic substrates and plastic substrates. Examples of the plastic substrates include epoxy substrates, bismaleimide triazine substrates, and polyimide substrates.

In the flip chip bonding step, the material of the bump and the conductive material is not particularly restricted and examples thereof include solders (alloys) such as tin-lead-based metal materials, tin-silver-based metal materials, tin-silver-copper-based metal materials, tin-zinc-based metal materials, and tin-zinc-bismuth-based metal materials, and gold-based metal materials and copper-based metal materials.

Incidentally, in the flip chip bonding step, the conductive material is melted to connect the bump at the circuit face side of the semiconductor chip 5 and the conductive material on the surface of the adherend 6. The temperature at the melting of the conductive material is usually about 260° C. (e.g., 250° C. to 300° C.). The thermally releasable sheet-integrated film for semiconductor back surface of the invention can be made to have thermal resistance capable of enduring the high temperature in the flip chip bonding step by forming the film for semiconductor back surface with an epoxy resin or the like.

In the present step, it is preferred to wash the opposing face (electrode-formed face) between the semiconductor chip 5 and the adherend 6 and the gaps. The washing liquid to be used at the washing is not particularly restricted and examples thereof include organic washing liquids and aqueous washing liquids. The film for semiconductor back surface in the thermally releasable sheet-integrated film for semiconductor back surface of the invention has solvent resistance against the washing liquid and has substantially no solubility to these washing liquid. Therefore, as mentioned above, various washing liquids can be employed as the washing liquid and the washing can be achieved by any conventional method without requiring any special washing liquid.

Next, an encapsulation step is performed for encapsulating the gaps between the flip chip-bonded semiconductor chip 5 and the adherend 6. The encapsulation step is performed using an encapsulating resin. The encapsulation conditions on this occasion are not particularly restricted but the curing of the encapsulating resin is usually carried out at 175° C. for 60 seconds to 90 seconds. However, in the invention, without limitation thereto, the curing may be performed at a temperature of 165 to 185° C. for several minutes, for example. By the thermal treatment in this step, not only the encapsulating resin but also the film for semiconductor back surface 2 is also thermally cured at the same time. Accordingly, both the encapsulating resin and the film for semiconductor back surface 2 are cured and shrunk with the procedure of the thermal curing. As a result, the stress to be given to the semiconductor chip 5 owing to the curing shrinkage of the encapsulating resin can be cancelled or relaxed through curing shrinkage of the film for semiconductor back surface 2. Moreover, in the step, the film for semiconductor back surface 2 can be completely or almost completely thermally cured and can be attached to the back surface of the semiconductor element with excellent close adhesiveness. Further, the film for semiconductor back surface 2 according to the invention can be thermally cured together with the encapsulating material in the encapsulation step even when the film is in an uncured state, so that it is not necessary to newly add a step for thermal curing of the film for semiconductor back surface 2.

The encapsulating resin is not particularly restricted as long as the material is a resin having an insulating property (an insulating resin) and may be suitably selected and used among known encapsulating materials such as encapsulating resins. The encapsulating resin is preferably an insulating resin having elasticity. Examples of the encapsulating resin include resin compositions containing an epoxy resin. As the epoxy resin, there may be mentioned the epoxy resins exemplified in the above. Furthermore, the encapsulating resin composed of the resin composition containing an epoxy resin may contain a thermosetting resin other than an epoxy resin (such as a phenol resin) or a thermoplastic resin in addition to the epoxy resin. Incidentally, a phenol resin can be utilized also as a curing agent for the epoxy resin and, as such a phenol resin, there may be mentioned phenol resins exemplified in the above.

According to the semiconductor device (flip chip-mounted semiconductor device) manufactured using the thermally releasable sheet-integrated film for semiconductor back surface 1, the film for semiconductor back surface is attached to the back surface of the semiconductor chip, and therefore, laser marking can be applied with excellent visibility. In particular, even when the marking method is a laser marking method, laser marking can be applied with an excellent contrast ratio, and it is possible to observe various kinds of information (for example, literal information and graphical information) applied by laser marking with good visibility. At the laser marking, a known laser marking apparatus can be utilized. Moreover, as the laser, it is possible to utilize various lasers such as a gas laser, a solid-state laser, and a liquid laser. Specifically, as the gas laser, any known gas lasers can be utilized without particular limitation but a carbon dioxide laser ($CO_2$ laser) and an excimer laser (ArF laser, KrF laser, XeCl laser, XeF laser, etc.) are suitable. As the solid-state laser, any known solid-state lasers can be utilized without particular limitation but a YAG laser (such as Nd:YAG laser) and a $YVO_4$ laser are suitable.

Since the semiconductor device produced using the thermally releasable sheet-integrated film for semiconductor back surface or the film for semiconductor back surface of the invention is a semiconductor device mounted by the flip chip mounting method, the device has a thinned and miniaturized shape as compared with a semiconductor device mounted by a die-bonding mounting method. Thus, the semiconductor devices can be suitably employed as various electronic devices and electronic parts or materials and members thereof. Specifically, as the electronic devices in which the flip chip-mounted semiconductor devices of the invention are utilized, there may be mentioned so-called "mobile phones" and "PHS", small-sized computers [e.g., so-called "PDA" (handheld terminals), so-called "notebook-sized personal computer", so-called "Net Book (trademark)", and so-called "wearable computers", etc.], small-sized electronic devices having a form where a "mobile phone" and a computer are integrated, so-called "Digital Camera (trademark)", so-called "digital video cameras", small-sized television sets, small-sized game machines, small-sized digital audio players, so-called "electronic notepads", so-called "electronic dictionary", electronic device terminals for so-called "electronic books", mobile electronic devices (portable electronic devices) such as small-sized digital type watches, and the like. Needless to say, electronic devices (stationary type ones, etc.) other than mobile ones, e.g., so-called "desktop personal computers", thin type television sets, electronic devices for recording and reproduction (hard disk recorders, DVD players, etc.), projectors, micromachines, and the like may be also mentioned. In addition, electronic parts or materials and members for electronic devices and electronic parts are not particularly restricted and examples thereof include parts for so-called "CPU" and members for various memory devices (so-called "memories", hard disks, etc.).

EXAMPLES

The following will illustratively describe preferred Examples of the invention in detail. However, the invention is not limited to the following Examples unless it exceeds the gist thereof. Moreover, part in each example is a weight standard unless otherwise stated.

<Preparation of Film for Semiconductor Back Surface>

A solution of an adhesive composition having a solid content concentration of 23.6 wt % was prepared by dissolving, in methyl ethyl ketone, 100 parts of an acrylic acid ester polymer ("Paracron W-197CM", trade name; product of Negami Chemical Industries) having ethyl acrylate-methyl acrylate as a main component, 113 parts of an epoxy resin ("Epicoat 1004", trade name; product of JER), 121 parts of a phenolic resin ("Milex XLC-3L", trade name; product of Mitsui Chemicals), 246 parts of spherical silica ("SO-25R", trade name; product of Admatechs), and 3 parts of a dye ("OIL BLACK BS", trade name; product of Orient Chemical Industries).

The solution of an adhesive composition thus prepared was applied onto a film which had been subjected to a silicone release treatment as a release liner (separator) and was composed of a polyethylene terephthalate film having a thickness of 50 followed by drying at 130° C. for 2 minutes to prepare a film for semiconductor back surface X having a thickness (average thickness) of 20 μM.

<Preparation of Thermally Releasable Sheet>

Preparation Example 1

A three-necked flask type reactor equipped with a thermometer, a stirrer, a nitrogen inlet tube, and a reflux condenser and having an internal capacity of 500 ml was charged with a mixture obtained by mixing 50 parts of n-butyl acrylate, 50 parts of 2-ethylhexyl acrylate, 5 parts of acrylic acid, 0.1 part of 2,2'-azobisisobutyronitrile, and 200 parts of ethyl acetate to give the total amount of 200 g. The resulting mixture was stirred while introducing a nitrogen gas for about 1 hour to purge the air inside the reactor with nitrogen. The temperature inside the reactor was then changed to 58° C. and polymerization was performed while maintaining the condition for about 4 hours to obtain an acrylic copolymer A.

An acrylic pressure-sensitive adhesive obtained by adding 2 parts of an isocyanate-based crosslinking agent to an ethyl acetate solution containing 100 parts of the acrylic copolymer A thus obtained was mixed with 35 parts of heat expandable microspheres ("MICROSPHERE F-50D", trade name; product of Matsumoto Yushi-Seiyaku). The resulting mixture was applied to one side of a PET film having a thickness of 50 μm, followed by drying to obtain a heat expandable layer having a thickness of 40 μm. An anti-contamination adherent layer having a thickness of 3 μm was provided on the heat expandable layer to obtain a thermally releasable pressure-sensitive adhesive sheet.

The anti-contamination adherent layer was prepared in the following manner. First, a three-necked flask type reactor equipped with a thermometer, a stirrer, a nitrogen inlet tube, and a reflux condenser and having an internal capacity of 500 ml was charged with a mixture obtained by mixing 50 parts of n-butyl acrylate, 50 parts of ethyl acrylate, 5 parts of acrylic acid, 0.1 part of 2,2'-azobisisobutyronitrile, and 200 parts of ethyl acetate to give the total amount of 200 g. The resulting mixture was stirred while introducing a nitrogen gas for about 1 hour to purge the air inside the reactor with nitrogen. The temperature inside the reactor was then changed to 57° C. and polymerization was performed while maintaining the condition for about 5 hours to obtain an acrylic copolymer B. An acrylic pressure-sensitive adhesive obtained by adding 3 parts of an epoxy-based crosslinking agent to an ethyl acetate solution containing 100 parts of the acrylic copolymer B thus obtained was applied onto a separator, followed by drying to form a film. The resulting film was transferred and attached to the heat expandable layer to provide an adherent layer thereon.

Preparation Example 2

In a similar manner to Preparation Example 1, a heat expandable layer was formed on one side of a PET film having a thickness of 50 μm. An anti-contamination type radiation-curable adherent layer having a thickness of 2 μm was provided on the resulting heat expandable layer to obtain a thermally releasable pressure-sensitive adhesive sheet. The anti-contamination type radiation-curable adherent layer was provided by applying an acrylic pressure-sensitive adhesive obtained by mixing the acrylic copolymer B with 100 parts of urethane acrylate, 3 parts of an isocyanate-based crosslinking agent, and 3 parts of a photopolymerization initiator onto a separator, drying the resulting film, and then transferring and attaching it to the heat expandable layer.

Preparation Example 3

A thermally releasable pressure-sensitive adhesive sheet was prepared by forming a heat expandable layer of 40 μm thick similar to that prepared in Preparation Example 1 on one side of a PET film having a thickness of 50 μm, providing, on the heat expandable layer, an anti-contamination adherent layer of 3 μm thick obtained by applying a mixture of 100 parts of an acrylic polymer C with 3 parts of an isocyanate-based crosslinking agent onto the heat expandable layer, followed by drying, and then covering the resulting adherent layer with a PET film (50 μm) subjected to release treatment.

The above-described acrylic copolymer C was prepared in the following manner. A three-necked flask type reactor equipped with a thermometer, a stirrer, a nitrogen inlet tube, and a reflux condenser and having an internal volume of 500 ml was charged with a mixture obtained by mixing 80 parts of 2-ethylhexyl acrylate, 20 parts of acryloylmonopholine, 3 parts of acrylic acid, 0.1 part of 2,2'-azobisisobutyronitrile, and 200 parts of ethyl acetate to give the total amount of 200 g. The resulting mixture was stirred while introducing a nitrogen gas therein for about 1 hour to purge the air in the reactor with nitrogen. The temperature inside the reactor was then changed to 58° C. and polymerization was performed while maintaining the condition for about 7 hours. The copolymer thus obtained was added to 1 L of heptane and the mixture was stirred. The solvent was removed without removing the precipitate and thus, a low-molecular-weight portion was removed. For the removal of the low-molecular-weight portion, a similar step was performed twice further. Ethyl acetate was then added to dissolve the precipitates therein to give the total amount of 200 g. The acrylic copolymer C was thus prepared.

Preparation Example 4

A thermally releasable pressure-sensitive adhesive sheet was prepared by foaming a heat expandable layer in a similar manner to Preparation Example 1 by using a PET base material (50 μm) and providing an anti-contamination radiation-curable adherent layer having a thickness of 5 μm on the heat expandable layer.

The anti-contamination radiation-curable adherent layer was prepared in the following manner. First, a three-necked flask type reactor equipped with a thermometer, a stirrer, a nitrogen inlet tube, and a reflux condenser and having an internal volume of 500 ml was charged with a mixture obtained by mixing 100 parts of an acrylic polymer D composed of 100 parts of butyl acrylate and 2 parts of hydroxyethyl acrylate with 1 part of methacryloyloxyethylene isocyanate, 0.1 part of 2,2'-azobisisobutyronitrile, and 200 parts of ethyl acetate to give the total amount of 200 g. The resulting mixture was stirred while introducing a nitrogen gas therein for about 1 hour to purge the air in the reactor with nitrogen. The temperature inside the reactor was then changed to 58° C. and polymerization was performed while maintaining the condition for about 5 hours to obtain an acrylic copolymer D.

An acrylic pressure-sensitive adhesive obtained by mixing the resulting acrylic copolymer D with 100 parts of urethane acrylate, 3 parts of an isocyanate-based crosslinking agent, and 3 parts of a photopolymerization initiator was applied onto a separator and dried. The film thus formed was then transferred and attached to the heat expandable layer. In such a manner, the adherent layer was prepared.

Preparation Example 5

In a similar manner to Preparation Example 1 except that the adherent layer was not provided on the heat expandable layer, a thermally releasable pressure-sensitive adhesive sheet was obtained.

Comparative Preparation Example 1

A pressure-sensitive adhesive sheet was prepared in a similar manner to Preparation Example 1 except that a simple adherent layer was formed using the acrylic pressure-sensitive adhesive A without mixing with heat expandable microspheres and on the resulting adherent layer, another adherent layer was not provided.
<Preparation of Thermally Releasable Sheet-Integrated Film for Semiconductor Back Surface>

Examples 1 to 5 and Comparative Example 1

The film for semiconductor back surface X was attached onto the pressure-sensitive adhesive layer of the thermally releasable sheet obtained in each of Preparation Examples and Comparative Preparation Example by using a laminator to prepare a thermally releasable sheet-integrated film for semiconductor back surface. The laminator was used under the following conditions:
(Conditions of Laminator)
    Laminator: "LPA330/450"
    Laminator temperature: 40° C.
    Laminator speed: 1600 mm/min
(Evaluation Method: Collection Rate of Chips)
    A wafer was mounted on the thermally releasable sheet-integrated film for semiconductor back surface prepared in each of Examples and Comparative Example. After dicing and heat treatment of the wafer, the picking-up property was evaluated and a collection rate of the resulting silicon chips having the film for semiconductor back surface attached thereto was determined (N=20). Incidentally, with regards to Example 2 and Example 4, chips obtained by dicing the wafer mounted on the thermally releasable sheet-integrated film for semiconductor back surface were exposed to ultraviolet rays and then, heat treated. They were picked up and evaluated for chip collection rate. The results are shown in Table 1.
    Described specifically, the chips were collected in the following manner. First, a semiconductor wafer (having a diameter of 8 inch and thickness of 0.6 mm, silicon mirror wafer) was subjected to back grinding treatment and a mirror wafer of 0.2 mm thick was used as a work. After a separator was released from the thermally releasable sheet-integrated film for semiconductor back surface, the mirror wafer (work) was bonded onto the film for semiconductor back surface at 70° C. by using roll pressure bonding. The wafer was then diced. Dicing was performed as full cut dicing so that the wafer was diced into a chip size of 10 mm square. Heat treatment was then performed to expand heat expandable microspheres. Finally, the semiconductor chip was collected with the film for semiconductor back surface. In Examples 2 and 4, curing treatment by exposure to ultraviolet rays was conducted after dicing but prior to the heat treatment. Grinding conditions of a semiconductor wafer, bonding conditions, dicing conditions, conditions of ultraviolet ray exposure, heating conditions, and picking-up conditions are as described below.

(Grinding Conditions of Semiconductor Wafer)
    Grinder: "DFG-8560" (trade name; product of DISCO Corporation)
    Semiconductor wafer: 8-inch diameter (back grinding from thickness of 0.6 mm to 0.2 mm)
(Bonding Conditions)
    Mounter: "MA-3000III" (trade name; product of Nitto Seiki)
    Mounting speed: 10 mm/min
    Mounting pressure: 0.15 Mpa
    Stage temperature upon mounting: 70° C.
(Dicing Conditions)
    Dicing saw: "DFD-6361" (trade name; product of DISCO Corporation)
    Dicing ring: "2-8-1" (product of DISCO Corporation)
    Dicing rate: 30 mm/sec
    Dicing blade
    Z1: "203O-SE 27HCDD" (trade name; product of DISCO Corporation)
    Z2: "203O-SE 27HCBB" (trade name; product of DISCO Corporation)
    Dicing blade revolution:
    Z1: 40,000 rpm
    Z2: 45,000 rpm
    Cutting system: step cut
    Wafer chip size: 10.0 mm square
(Irradiation Conditions of Ultraviolet Rays)
    Ultraviolet (UV) irradiator: high-pressure mercury lamp
    UV Accumulated light amount: 500 mJ/cm$^2$
    Output: 75 W
    Irradiation intensity: 150 mW/cm$^2$
(Heating Conditions)
    Heating temperature: 180° C.
    Heating time: 30 seconds
(Semiconductor Wafer Picking-Up Conditions)
    Picking-up apparatus: "SPA-300", trade name; product of Shinkawasha
    The number of pick-up needles: 9
    Pushing-up speed of needle: 30 mm/s
    Pushing-up amount of needle: 500 μm
    Picking-up time: 1 second
    Expanded amount of thermally releasable sheet: 3 mm
(Evaluation Method: Evaluation of ΔC and C/Si)
    To find the degree of contamination of the film for semiconductor back surface due to organic matters and the like derived from the pressure-sensitive adhesive layer, the degree of adhesion of the organic matters and the like was evaluated using X-ray electron spectroscopy for chemical analysis (ESCA). The film for semiconductor back surface is however composed of an organic polymer component so that a change in the amount of organic matters cannot be detected easily even by directly measuring the amount on the surface of the film for semiconductor back surface so that a semiconductor wafer, instead of the film for semiconductor back surface, was attached to a thermally releasable sheet and the degree of adhesion of the organic matters and the like to the surface of the semiconductor wafer was used as an indicator of the degree of contamination of the film for semiconductor back surface.
    Described specifically, the evaluation was made as follows. The (thermally releasable) pressure-sensitive adhesive sheet obtained in each of Examples and Comparative Example was attached to a 4-inch and mirror-polished silicon wafer. After the resulting wafer was left to stand for one hour, it was heat treated in accordance with the heat treatment procedure conducted in the evaluation of a chip collection rate. The pressure-sensitive adhesive sheet was then released from the silicon wafer at 23° C., a peel angle of 180°, and a pulling rate of 300 mm/min. A surface carbon ratio C1(%) of the surface of the thus released silicon wafer was measured using an ESCA instrument and at the same time, a surface Si ratio Si (%) was also measured. Separately, a surface carbon ratio C2(%) of the surface of the mirror-polished 4-inch silicon wafer was determined using the ESCA apparatus. The ΔC and C/Si are calculated in accordance with the following formula. The results are shown in Table 1.

ΔC=(surface carbon ratio C1(%))−(surface carbon ratio C2(%))

C/Si=(surface carbon ratio C1(%))/(surface Si ratio Si (%))

(ESCA Measurement Conditions)
ESCA (XPS) instrument: "5400" (trade name; product of ULVAC-PHI, INC.)
X-ray source: MgKα 15 kV (300 W)
(Evaluation Method of Surface Roughness Ra)
The surface roughness (Ra) of the pressure-sensitive adhesive layer of the thermally releasable sheet after heating was measured using a non-contact three-dimensional roughness gauge ("NT3300", trade name; product of Veeco Instruments) according to JIS B0601. The measurement condition was 50-fold-power. The data found were processed through a Median filter. Each of the thermally releasable sheets was analyzed at different 5 sites therein and the data were averaged to give the surface roughness (Ra) of the sheet. The results are shown in Table 1.

TABLE 1

|  | | Chip collection [%] | ΔC [%] | | C/Si [%] | | Surface roughness [μm] |
|---|---|---|---|---|---|---|---|
|  | | | Before heating | After heating | Before heating | After heating | |
| Ex. 1 | | 100 | 15.0 | 25.0 | 0.7 | 2.2 | 3 |
| Ex. 2 | Before exposure to UV | — | 14.0 | — | 0.7 | — | — |
|  | After exposure to UV | 100 | — | 12.0 | — | 0.65 | 2.5 |
| Ex. 3 | | 100 | 4.0 | 19.0 | 0.4 | 1.1 | 3.5 |
| Ex. 4 | Before exposure to UV | — | 10.0 | — | 0.5 | — | — |
|  | After exposure to UV | 100 | — | 1.5 | — | 0.3 | 2.5 |
| Ex. 5 | | 100 | 12.0 | 65.0 | 0.6 | 5.0 | 8.5 |
| Comp. Ex. 1 | | 15 | 14.0 | 50.0 | 0.7 | 3.0 | 2.5 |

As is apparent from Table 1, the thermally releasable sheet-integrated films for semiconductor back surface obtained in Examples each exhibits a chip collection rate of 100%, thus having a good picking-up property. On the other hand, the film of Comparative Example 1 composed of a pressure-sensitive sheet containing no heat expandable microspheres exhibits a chip collection rate as low as 15%, which is presumed to occur because the peel force between the pressure-sensitive sheet and the film for semiconductor back surface is too strong to pick up semiconductor elements. In the film of Example 5 having no adherent layer provided thereon, compared with the films of Examples 1 to 4 having an anticontamination adherent layer provided on the heat expandable layer, ΔC and C/Si after heating to expand the heat expandable microspheres and the surface roughness Ra of the thermally releasable sheet are high, suggesting that it is preferred to provide a non-expandable adherent layer in order to suppress contamination and unevenness of the film for semiconductor back surface. Further, the surface roughness Ra of the films obtained in Examples 2 and 4 using a UV curable pressure-sensitive adhesive layer is a little smaller than that of the films obtained in Examples 1 and 3, suggesting that when the film for semiconductor back surface is required to have flatness further, using a UV curable pressure-sensitive adhesive layer is preferred.

While the present invention has been described in detail and with reference to specific embodiments thereof, it will be apparent to one skilled in the art that various changes and modifications can be made therein without departing from the scope thereof.

This application is based on Japanese patent application No. 2010-170919 filed Jul. 29, 2010, the entire contents thereof being hereby incorporated by reference.

What is claimed is:

1. A thermally releasable sheet-integrated film for semiconductor back surface, which comprises:
    a pressure-sensitive adhesive sheet comprising a base material layer and a pressure-sensitive adhesive layer, and
    a film for semiconductor back surface formed on the pressure-sensitive adhesive layer of the pressure-sensitive adhesive sheet,
    wherein the pressure-sensitive adhesive sheet is a thermally releasable pressure-sensitive adhesive sheet whose peel force from the film for semiconductor back surface decreases upon heating,
    wherein the film for semiconductor back surface has a thickness of 2 to 200 nm, a moisture absorbance of 1% by weight or less after the film semiconductor back surface is allowed to stand under an atmosphere of a temperature of 85° C. and a humidity of 85% RH for 168 hours, and a weight decrease ratio of 1% by weight or less after heating at 250° C. for 1 hour.

2. The thermally releasable sheet-integrated film for semiconductor back surface according to claim 1, wherein the pressure-sensitive adhesive layer comprises a heat expandable layer containing heat expandable microspheres which expand upon heating.

3. The thermally releasable sheet-integrated film for semiconductor back surface according to claim 2, wherein the pressure-sensitive adhesive layer further comprises a non-heat expandable adherent layer formed on the heat expandable layer and between the film for semiconductor back surface and the heat expandable layer.

4. The thermally releasable sheet-integrated film for semiconductor back surface according to claim 2, wherein the heat expandable microspheres have a starting temperature of thermal expansion of 100° C. or greater.

5. The thermally releasable sheet-integrated film for semiconductor back surface according to claim 2, wherein the heat expandable microspheres show a volume expansion of 5 times or greater.

6. The thermally releasable sheet-integrated film for semiconductor back surface according to claim 2, wherein the pressure-sensitive adhesive sheet further comprises a rubbery organic elastic layer between the base material layer and the heat expandable layer.

7. A method of collecting a semiconductor element, which comprises:
- attaching a semiconductor wafer onto the film for semiconductor back surface of the thermally releasable sheet-integrated film for semiconductor back surface according to claim 1;
- dicing the semiconductor wafer to form a semiconductor element;
- heating the thermally releasable sheet-integrated film for semiconductor back surface; and
- releasing the semiconductor element together with the film for semiconductor back surface, from the pressure-sensitive adhesive layer of the thermally releasable sheet.

8. A method of producing a semiconductor device, which comprises flipchip connecting, onto an adherend, a semiconductor element collected by the method of collecting a semiconductor element according to claim 7.

9. The thermally releasable sheet-integrated film for semiconductor back surface according to claim 1, wherein the film for semiconductor back surface is colored.

\* \* \* \* \*